US012609663B2

(12) United States Patent
Arima et al.

(10) Patent No.: US 12,609,663 B2
(45) Date of Patent: Apr. 21, 2026

(54) RADIO-FREQUENCY MODULE AND COMMUNICATION DEVICE

(71) Applicant: Murata Manufacturing Co., Ltd., Nagaokakyo (JP)

(72) Inventors: Keisuke Arima, Nagaokakyo (JP); Isao Takenaka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 456 days.

(21) Appl. No.: 18/474,222

(22) Filed: Sep. 26, 2023

(65) Prior Publication Data

US 2024/0154588 A1 May 9, 2024

(30) Foreign Application Priority Data

Nov. 8, 2022 (JP) ................................. 2022-178784

(51) Int. Cl.
*H03F 3/24* (2006.01)
*H03F 1/56* (2006.01)
*H04B 1/04* (2006.01)

(52) U.S. Cl.
CPC ............. *H03F 3/245* (2013.01); *H03F 1/565* (2013.01); *H03F 2200/387* (2013.01); *H03F 2200/451* (2013.01); *H04B 1/04* (2013.01)

(58) Field of Classification Search
CPC .... H03F 3/245; H03F 1/565; H03F 2200/387; H03F 2200/451; H04B 1/04
USPC ........................................................ 330/291
See application file for complete search history.

(56) References Cited

U.S. PATENT DOCUMENTS

| | | | | |
|---|---|---|---|---|
| 6,026,286 | A * | 2/2000 | Long ........................ | H04B 1/28 |
| | | | | 455/341 |
| 7,719,141 | B2 * | 5/2010 | McMorrow .............. | H04B 1/48 |
| | | | | 307/115 |
| 9,333,034 | B2 * | 5/2016 | Hancock ................ | H05B 6/806 |
| 10,903,806 | B2 * | 1/2021 | Anderson .............. | H03F 1/565 |
| 11,901,867 | B2 * | 2/2024 | Honda .................... | H03F 3/195 |
| 2008/0117894 | A1 * | 5/2008 | McMorrow ............. | H03F 3/217 |
| | | | | 370/359 |
| 2012/0112835 | A1 * | 5/2012 | Comeau .............. | H03F 3/45089 |
| | | | | 330/252 |
| 2016/0248453 | A1 * | 8/2016 | Matsuno .............. | H04B 1/0458 |
| 2017/0302307 | A1 * | 10/2017 | Matsuno .............. | H04B 1/0475 |
| 2021/0288680 | A1 * | 9/2021 | Takahashi ................ | H03F 3/26 |
| 2021/0399701 | A1 * | 12/2021 | Honda .................... | H03F 3/195 |

(Continued)

FOREIGN PATENT DOCUMENTS

| | | |
|---|---|---|
| JP | 2016-158053 A | 9/2016 |
| WO | 2018/168603 A1 | 9/2018 |

*Primary Examiner* — Hafizur Rahman
(74) *Attorney, Agent, or Firm* — XSENSUS LLP

(57) ABSTRACT

A radio-frequency module includes amplifiers and, a transformer including a primary coil and a secondary coil, an antenna connection terminal, an inductor disposed in series between one end of the secondary coil and the antenna connection terminal, and a capacitor connected between a path connecting the one end of the secondary coil and the inductor and a ground. One end of the primary coil is connected to an output end of the amplifier, another end of the primary coil is connected to an output end of the amplifier, another end of the secondary coil is connected to the ground, and the secondary coil and the inductor are coupled to each other via magnetic field coupling.

20 Claims, 9 Drawing Sheets

(56) References Cited

U.S. PATENT DOCUMENTS

| | | | |
|---|---|---|---|
| 2022/0278703 A1* | 9/2022 | Shounai | ............... H04B 1/0458 |
| 2022/0352854 A1* | 11/2022 | Ohmae | .................... H03F 1/30 |

* cited by examiner

COMPARATIVE EXAMPLE

RADIO-FREQUENCY MODULE AND COMMUNICATION DEVICE

CROSS-REFERENCE TO RELATED APPLICATION

This application claims priority to Japanese Patent Application No. JP 2022-178784 filed on Nov. 8, 2022. The entire contents of the above-identified applications, including the specifications, drawings and claims, are incorporated herein by reference in their entirety.

BACKGROUND OF THE DISCLOSURE

1. Field of the Disclosure

The present disclosure relates to a radio-frequency module and a communication device.

2. Description of the Related Art

Japanese Unexamined Patent Application Publication No. 2016-158053 discloses a semiconductor device including an amplifier, a transformer that converts signals output from the amplifier from a balanced signal to an unbalanced signal, and a filter connected to the transformer. An unbalanced-side inductor of the transformer and an inductor constituting a resonant circuit of the filter are coupled by mutual inductance to thereby enable an increase in Q factor of the resonant circuit.

SUMMARY OF THE DISCLOSURE

In the semiconductor device disclosed in Japanese Unexamined Patent Application Publication No. 2016-158053, however, in improving attenuation characteristics of the resonant circuit, it is impossible to reduce the number of components, such as an inductor, constituting the resonant circuit.

The present disclosure has been made to overcome the above-described issue and aims to provide a radio-frequency module and a communication device in which the number of components of a resonant circuit is reduced.

To achieve the above-described aim, a radio-frequency module according to an aspect of the present disclosure includes a first amplifier and a second amplifier, a transformer including a primary coil and a secondary coil, an output terminal, a first inductor disposed in series between one end of the secondary coil and the output terminal, and a first capacitor connected between a path connecting the one end and the first inductor and a ground. One end of the primary coil is connected to an output end of the first amplifier, another end of the primary coil is connected to an output end of the second amplifier, another end of the secondary coil is connected to the ground, and the secondary coil and the first inductor are coupled to each other via magnetic field coupling.

Furthermore, a radio-frequency module according to another aspect of the present disclosure includes a first amplifier and a second amplifier, a transformer including a primary coil and a secondary coil, an output terminal, a first inductor disposed in series between one end of the secondary coil and the output terminal, and a first capacitor connected between a path connecting the one end and the first inductor and a ground. One end of the primary coil is connected to an output end of the first amplifier, another end of the primary coil is connected to an output end of the second amplifier, another end of the secondary coil is connected to the ground, and the secondary coil and the first inductor are disposed so as to be adjacent to each other. Assuming the first inductor is viewed in a direction of a winding axis of the secondary coil, the secondary coil and the first inductor at least partially overlap each other, and, assuming the secondary coil is viewed in a direction of a winding axis of the first inductor, the first inductor and the secondary coil at least partially overlap each other.

Furthermore, a radio-frequency module according to still another aspect of the present disclosure includes a first amplifier and a second amplifier, an output terminal, a first LC series circuit including a first inductor and a first capacitor connected in series with each other, a second LC series circuit including a second inductor and a second capacitor connected in series with each other, a first matching network including a third inductor and a third capacitor, and a second matching network including a fourth inductor and a fourth capacitor. The first LC series circuit is connected between a first path connecting an output end of the first amplifier and the output terminal and a ground, the second LC series circuit is connected between a second path connecting an output end of the second amplifier and the output terminal and the ground, the first matching network is connected to the first path, the second matching network is connected to the second path, and the first inductor and the second inductor are coupled to each other via magnetic field coupling.

The present disclosure can provide the radio-frequency module and a communication device in which the number of components of a resonant circuit is reduced.

DESCRIPTION OF THE PREFERRED EMBODIMENTS

Figure 1:
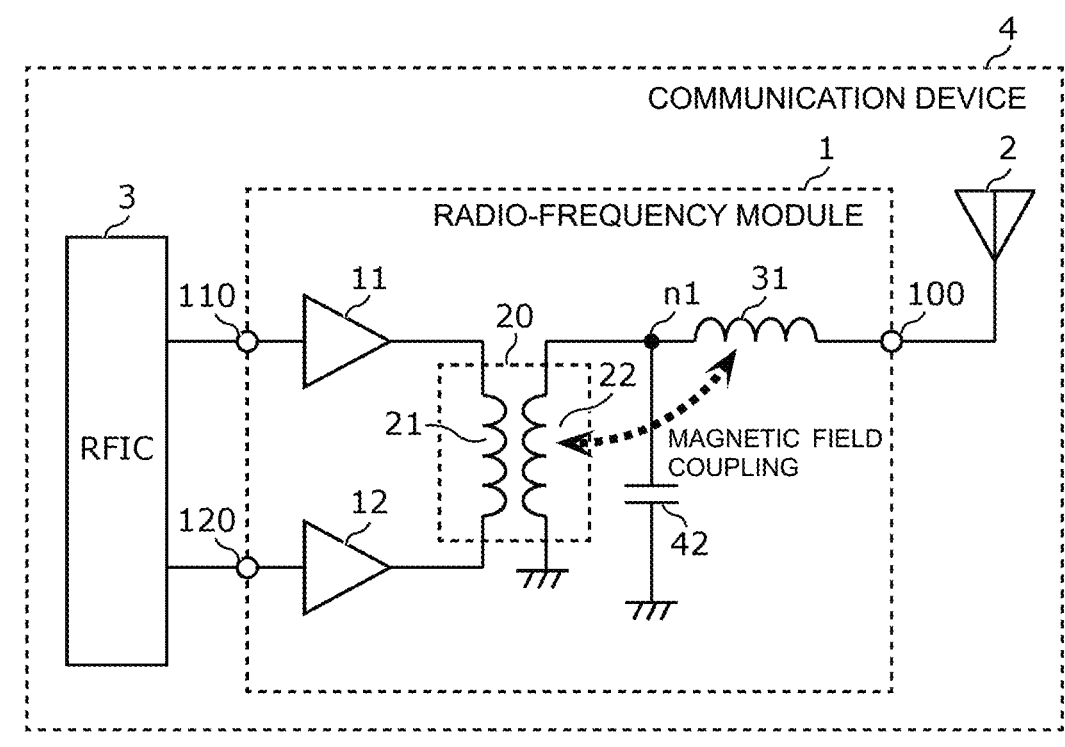
FIG. 1 is a circuit configuration diagram of a radio-frequency module and a communication device according to Embodiment 1.

Embodiments of the present disclosure will be described in detail below. Note that all of the embodiments to be described below describe comprehensive or specific examples. Numerical values, shapes, materials, components, the arrangement and connection configuration of the components, and so forth that are described in the following embodiments are merely examples and are not intended to limit the present disclosure. Of components in the following practical examples and modifications, a component not described in an independent claim is described as an optional component. Furthermore, the sizes or size ratio of components illustrated in drawings are or is not necessarily exact. In figures, components that are substantially the same are denoted by the same reference signs, and a repetitive description thereof is omitted or simplified in some cases.

Furthermore, in the present disclosure, terms, such as parallel and perpendicular, representing a relationship between elements, a term, such as rectangular, representing the shape of an element, and a numerical range refer to not only their exact meanings but also the inclusion of a substantially equivalent range, for example, a difference of about a few percent.

Furthermore, in the present disclosure, assuming an element is referred to as being "connected" to another element, the element can not only be directly connected to the other element by using a connection terminal and/or a line conductor, but also electrically via another circuit element. Additionally, assuming an element is referred to as being "connected between A and B", the element is connected to A and B on a path connecting A and B.

Furthermore, in the present disclosure, a description that a substrate is viewed in plan refers to the fact that the substrate and circuit elements mounted in or on the substrate are orthographically projected onto a plane parallel to a main surface of the substrate and are viewed.

Furthermore, in the layout of components in the present disclosure, "a component is disposed on a substrate" includes the fact that the component is disposed on a main surface of the substrate and the fact that the component is disposed within the substrate. "The component is disposed on the main surface of the substrate" includes, in addition to the fact that the component is disposed with being in contact with the main surface of the substrate, the fact that the component is disposed above the main surface without being in contact with the main surface (for example, the fact that the component is stacked on another component that is disposed with being in contact with the main surface). Additionally, "the component is disposed on the main surface of the substrate" may include the fact that the component is disposed in a recess formed in the main surface. "The component is disposed within the substrate" includes, in addition to the fact that the component is encapsulated into a module substrate, the fact that the whole of the component is disposed between both main surfaces of the substrate without part of the component being covered by the substrate, and the fact that part of the component is disposed within the substrate.

Furthermore, in the present disclosure, "path" refers to a transmission line constituted by a line through which a radio-frequency signal propagates, an electrode connected directly to the line, a terminal connected directly to the line or the electrode, and so forth.

Furthermore, in the present disclosure, "a component A is disposed in series in a path B" refers to the fact that both of a signal input end and a signal output end of the component A are connected to a line, electrode, or terminal constituting the path B.

Furthermore, in the layout of components in the present disclosure, a description that a circuit element A (or line A) and a circuit element B (or line B) are disposed so as to be adjacent to each other (or are next to each other) refers to the fact that there are no other circuit elements (and lines) disposed between the circuit element A (or line A) and the circuit element B (or line B).

Embodiment 1

1. Configuration of Radio-Frequency Module and Communication Device

A circuit configuration of a radio-frequency module 1 and a communication device 4 according to this embodiment will be described with reference to FIG. 1. FIG. 1 is a circuit configuration diagram of the radio-frequency module 1 and the communication device 4 according to Embodiment 1.

1.1 Circuit Configuration of Communication Device 4

First, the circuit configuration of the communication device 4 will be described. As illustrated in FIG. 1, the communication device 4 according to this embodiment includes the radio-frequency module 1, an antenna 2, and an RF signal processing circuit (radio frequency integrated circuit (RFIC)) 3.

The radio-frequency module 1 transmits a radio-frequency signal between the antenna 2 and the RFIC 3. The detailed circuit configuration of the radio-frequency module 1 will be described later.

The antenna 2 is connected to an antenna connection terminal 100 of the radio-frequency module 1 and transmits a radio-frequency signal output from the radio-frequency module 1. Incidentally, the antenna 2 may receive a radio-frequency signal from the outside and output the radio-frequency signal to the radio-frequency module 1.

The RFIC 3 is an example of a signal processing circuit that processes a radio-frequency signal. Specifically, the RFIC 3 performs, for example, through up-conversion, signal processing on a transmission signal input from a baseband signal processing circuit (BBIC, which is not illustrated) and outputs a transmission signal generated through the signal processing to a transmission path of the radio-frequency module 1. Incidentally, the RFIC 3 may perform, for example, through down-conversion, signal processing on a reception signal input through a reception path of the radio-frequency module 1 and output a reception signal generated through the signal processing to the BBIC.

Furthermore, the RFIC 3 also functions as a control unit that controls a power-supply voltage and a bias voltage (current) that are to be supplied to amplifiers included in the radio-frequency module 1. Incidentally, some or all of functions of the RFIC 3 as the control unit may be implemented outside the RFIC 3 and may be implemented, for example, in the BBIC or radio-frequency module 1.

Incidentally, in the communication device 4 according to this embodiment, the antenna 2 is not an indispensable component.

1.2 Circuit Configuration of Radio-Frequency Module 1

Next, the circuit configuration of the radio-frequency module 1 will be described. As illustrated in FIG. 1, the radio-frequency module 1 includes amplifiers 11 and 12, a transformer 20, an inductor 31, a capacitor 42, the antenna connection terminal 100, and signal input terminals 110 and 120.

The antenna connection terminal 100 is an example of an output terminal and is connected to the inductor 31 and the antenna 2. The signal input terminal 110 is connected to the RFIC 3 and the amplifier 11. The signal input terminal 120 is connected to the RFIC 3 and the amplifier 12.

The amplifier 11 is an example of a first amplifier, an input end thereof is connected to the signal input terminal 110, and an output end thereof is connected to the transformer 20. The amplifier 11 amplifies a radio-frequency transmission signal (hereinafter, referred to as a transmission signal) input from the signal input terminal 110. In this embodiment, the amplifier 11 is a power amplifier.

The amplifier 12 is an example of a second amplifier, an input end thereof is connected to the signal input terminal 120, and an output end thereof is connected to the transformer 20. The amplifier 12 amplifies a transmission signal input from the signal input terminal 120. In this embodiment, the amplifier 12 is a power amplifier.

Each of the amplifiers 11 and 12 includes an amplifier transistor. The above-described amplifier transistor is, for example, a bipolar transistor, such as a heterojunction bipolar transistor (HBT), or a field-effect transistor, such as a metal-oxide-semiconductor field-effect transistor (MOSFET).

The transformer 20 is an example of a transformer and includes a primary coil 21 and a secondary coil 22. The primary coil 21 and the secondary coil 22 are coupled to each other via magnetic field coupling. One end of the primary coil 21 is connected to the output end of the amplifier 11, and the other end is connected to the output end of the amplifier 12. One end of the secondary coil 22 is connected to the antenna connection terminal 100 via the inductor 31, and the other end is connected to a ground. In the above-described configuration, the transformer 20 combines the power of a first balanced-signal output from the amplifier 11 and the power of a second balanced-signal output from the amplifier 12 to convert a resultant signal into an unbalanced signal.

That is, the amplifiers 11 and 12 constitute a power amplifier circuit of a differential amplifier type. Incidentally, the amplifiers 11 and 12 may constitute a Doherty power amplifier circuit.

The inductor 31 is an example of a first inductor and is disposed in series between the one end of the secondary coil 22 and the antenna connection terminal 100. Specifically, one end of the inductor 31 is connected to the one end of the secondary coil 22, and the other end is connected to the antenna connection terminal 100. Incidentally, the inductor 31 may be a chip surface-mount component or may be a planar coil formed in or on a module substrate.

The inductor 31 is an element for providing impedance matching between the transformer 20 and a circuit component connected to the antenna 2 or antenna connection terminal 100.

The capacitor 42 is an example of a first capacitor and is connected between a path connecting the one end of the secondary coil 22 and the inductor 31 and the ground.

Specifically, one end of the capacitor 42 is connected to a node n1 on the path connecting the one end of the secondary coil 22 and the inductor 31, and the other end is connected to the ground. Incidentally, the capacitor 42 may be a chip surface-mount component or may be constituted by a planar electrode formed in or on the module substrate.

In the above-described configuration, the inductor 31 and the secondary coil 22 are coupled to each other via magnetic field coupling.

Incidentally, there are no inductors connected between the node n1 and the capacitor 42 and between the capacitor 42 and the ground.

Furthermore, the radio-frequency module 1 may include a filter connected between the inductor 31 and the antenna connection terminal 100. In this case, the inductor 31 provides impedance matching between the transformer 20 and the filter.

Figure 2:
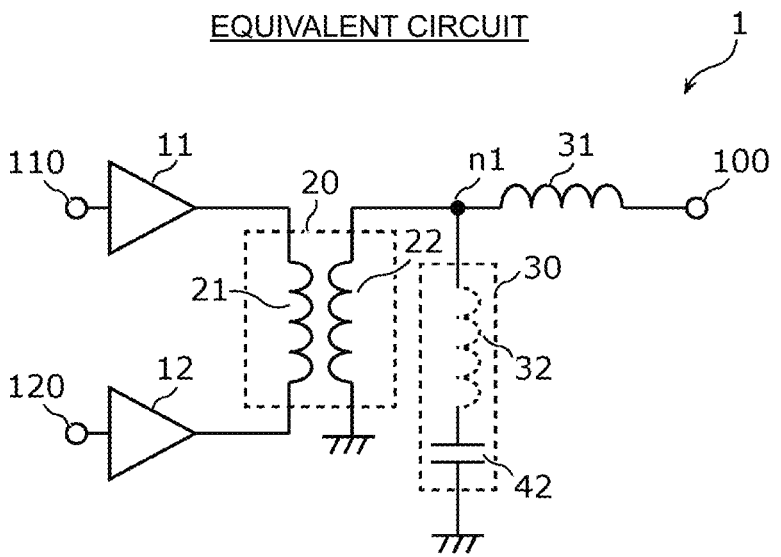
FIG. 2 is a circuit configuration diagram illustrating an equivalent circuit of the radio-frequency module according to Embodiment 1.

FIG. 2 is a circuit configuration diagram illustrating an equivalent circuit of the radio-frequency module 1 according to Embodiment 1. The equivalent circuit illustrated in FIG. 2 differs from an actual circuit of the radio-frequency module 1 illustrated in FIG. 1 in that a mutual inductance component 32 is generated between the node n1 and the capacitor 42.

Assuming the secondary coil 22 and the inductor 31 couple to each other via magnetic field coupling, the mutual inductance component 32 is newly generated between the node n1 disposed between the secondary coil 22 and the inductor 31 and the capacitor 42. Assuming the mutual inductance component 32 is added to the node n1, the mutual inductance component 32 is added in series to the capacitor 42, and the capacitor 42 constitutes an LC series resonant circuit 30 connected between the node n1 and the ground.

In the LC series resonant circuit 30, impedance reaches a minimum at a resonant frequency defined by an inductance value of the mutual inductance component 32 and a capacitance value of the capacitor 42. Because of this, in bandpass characteristics of a radio-frequency signal that is transmitted from the one end of the secondary coil 22 to the antenna connection terminal 100, an attenuation pole can be formed at the above-described resonant frequency. Hence, a predetermined frequency band of a radio-frequency signal that is transmitted by the radio-frequency module 1 can be attenuated.

Incidentally, it is desirable that the inductor 31 and the secondary coil 22 be coupled to each other in opposite polarity via magnetic field coupling. Note that a description that two inductors are coupled to each other in opposite polarity via magnetic field coupling refers to the fact that magnetic fluxes penetrating through the respective inductors are opposite in direction. Incidentally, the fact that magnetic fluxes are opposite in direction is defined as the fact that an angle formed by magnetic flux vectors representing the respective directions of the magnetic fluxes is in a range of $180°±45°$.

Figure 3:
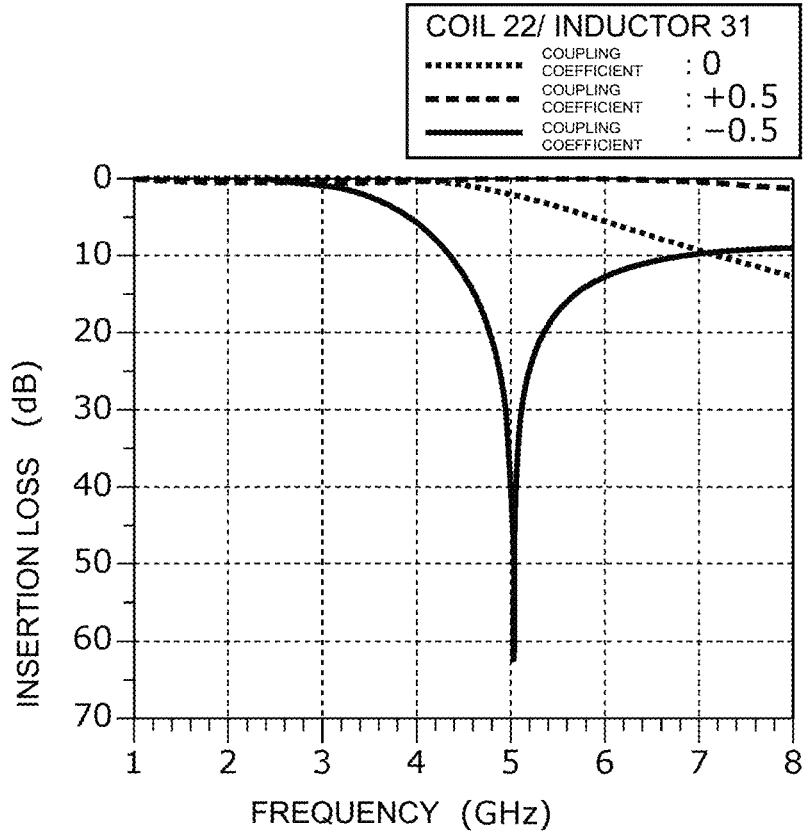
FIG. 3 is a graph illustrating bandpass characteristics radio-frequency modules according to Embodiment 1 and a comparative example.

FIG. 3 is a graph illustrating bandpass characteristics of radio-frequency modules according to Embodiment 1 and a comparative example. FIG. 3 illustrates bandpass characteristics of the one end of the secondary coil 22—the antenna connection terminal 100 in the radio-frequency module 1 according to this embodiment (coupling coefficient: −0.5), and bandpass characteristics of the one end of the secondary coil 22—the antenna connection terminal 100 in a radio-frequency module according to the comparative example (coupling coefficient: +0.5 and coupling coefficient: 0).

Incidentally, the radio-frequency module according to the comparative example is the same in circuit connection configuration as the radio-frequency module 1 according to this embodiment but differs from the radio-frequency module 1 in magnetic field coupling coefficient between the secondary coil 22 and the inductor 31.

In the radio-frequency module according to the comparative example (coupling coefficient: +0.5 and coupling coefficient: 0), no attenuation pole has been formed at frequencies of 1 to 8 GHz.

On the other hand, in the radio-frequency module 1 according to this embodiment (coupling coefficient: −0.5), an attenuation pole corresponding to the resonant frequency of the LC series resonant circuit 30 has been formed near a frequency of 5 GHz.

As a result, the LC series resonant circuit 30 is formed, with no inductor for the LC series resonant circuit 30 being disposed, by using the secondary coil 22 disposed to combine signals and the inductor 31 disposed to provide impedance matching. Hence, the number of components of the LC series resonant circuit 30 can be reduced.

Incidentally, to form the LC series resonant circuit 30 connected between the node n1 and the ground, magnetic field coupling between an inductor (secondary coil 22) connected between the node n1 and the ground and the inductor 31 disposed in series between the node n1 and the antenna connection terminal 100 is necessary.

Hence, in the following cases of (1) a configuration where the inductor 31 is connected (connected in shunt) between a node on a path connecting the one end of the secondary coil 22 and the antenna connection terminal 100 and the ground, (2) a configuration where the capacitor 42 is connected between a path connecting the inductor 31 and the antenna connection terminal 100 and the ground, and (3) a configuration where the capacitor 42 is disposed in series in a path connecting the inductor 31 and the antenna connection terminal 100, the LC series resonant circuit 30 is not formed between a node on a path connecting the one end of the secondary coil 22 and the antenna connection terminal 100 and the ground.

Incidentally, the radio-frequency module 1 according to this embodiment may be a module that transmits a reception signal. In this case, each of the amplifiers 11 and 12 is a low noise amplifier. Furthermore, the signal input terminals 110 and 120 are connected to the antenna, and the antenna connection terminal 100 is connected to the RFIC 3.

1.3 Layout and Configuration of Components of Radio-Frequency Module 1

Next, the layout and configuration of components of the radio-frequency module 1 will be described.

Figure 4A:
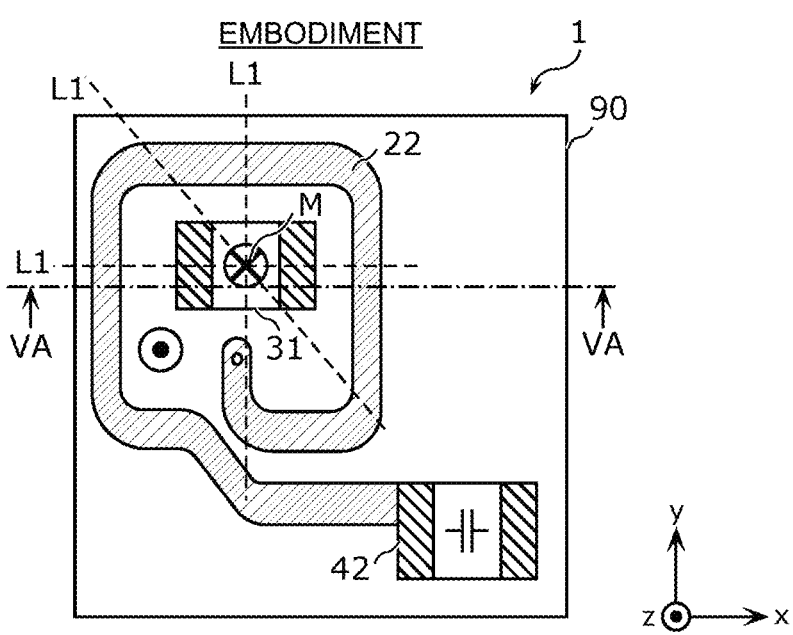
FIG. 4A is a schematic plan view of the radio-frequency module according to Embodiment 1.
Figure 4B:
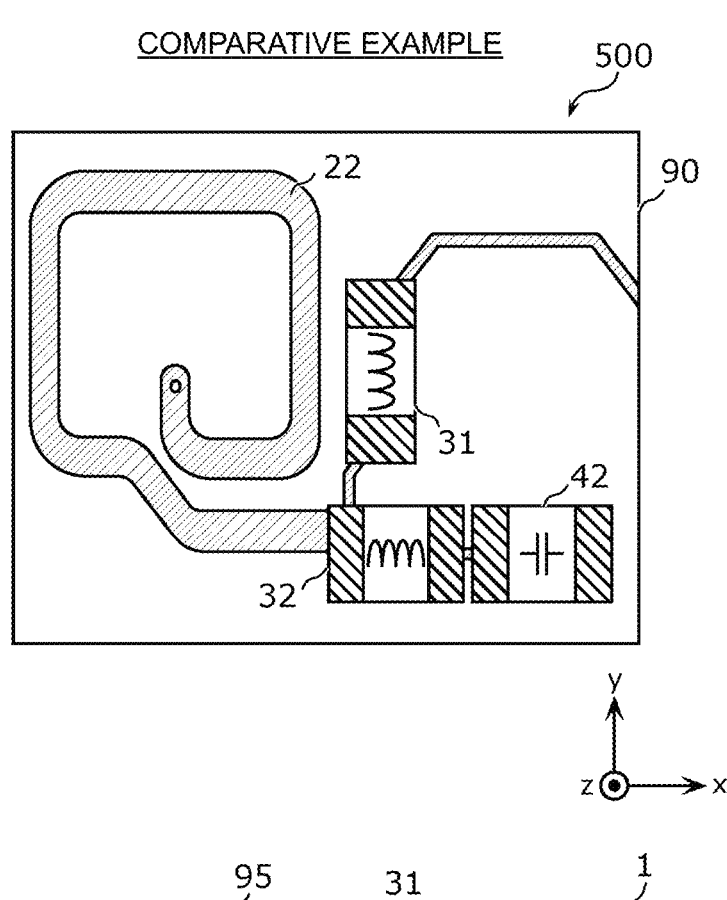
FIG. 4B is a schematic plan view of a radio-frequency module according to a comparative example.
Figure 5A:
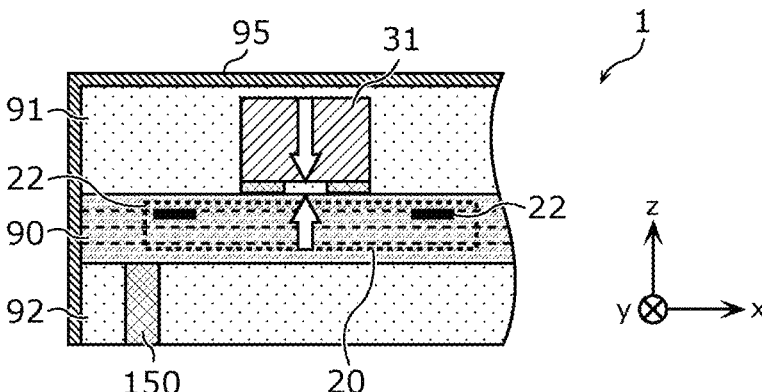
FIG. 5A is a schematic cross-sectional view of the radio-frequency module according to Embodiment 1.

FIG. 4A is a schematic plan view of the radio-frequency module 1 according to Embodiment 1. FIG. 4B is a schematic plan view of a radio-frequency module 500 according to a comparative example. FIG. 5A is a schematic cross-sectional view of the radio-frequency module 1 according to Embodiment 1. FIG. 5A illustrates a cross-section taken along line VA-VA in FIG. 4A.

Incidentally, the radio-frequency module 500 according to the comparative example differs from the radio-frequency module 1 according to Embodiment 1 in that (1) an inductor (represented as an inductor 32 in FIG. 4B) having an inductance value of the mutual inductance component 32 is actually connected and disposed between the node n1 and the capacitor 42 and in that (2) the inductor 31 and the secondary coil 22 are not coupled to each other via magnetic field coupling.

As illustrated in FIG. 4B, in the radio-frequency module 500 according to the comparative example, the inductors 31 and 32 and the capacitor 42 are disposed on a main surface of a module substrate 90. Furthermore, the secondary coil 22 is constituted by a planar coil formed in or on the module substrate 90. Since the secondary coil 22 does not couple to another circuit component via magnetic field coupling, the secondary coil 22 does not overlap the inductors 31 and 32 and the capacitor 42 assuming the main surface of the module substrate 90 is viewed in plan.

On the other hand, as illustrated in FIG. 4A, in the radio-frequency module 1 according to this embodiment, the inductor 31 and the capacitor 42 are disposed on the main surface of the module substrate 90. Furthermore, the mutual inductance component 32 constituting the LC series resonant circuit 30 is not disposed in the form of a circuit component. Additionally, as illustrated in FIG. 5A, the secondary coil 22 is constituted by a planar coil formed in the module substrate 90, and the inductor 31 is a surface-mount chip inductor disposed on the module substrate 90. Furthermore, a resin member 91 is disposed on a front side of the module substrate 90, and a resin member 92 is disposed on a back side. Additionally, on the back side of the module substrate 90, an external connection terminal 150 is disposed, and a shield electrode layer 95 is disposed so as to cover the resin members 91 and 92 and sides of the module substrate 90. Incidentally, the resin members 91 and 92, the external connection terminal 150, and the shield electrode layer 95 are not indispensable components for the radio-frequency module 1.

Furthermore, in the radio-frequency module 1 according to this embodiment, assuming the inductor 31 is viewed in a direction (z-axis direction) of a winding axis of the secondary coil 22, the secondary coil 22 (a region where the secondary coil 22 is formed) and the inductor 31 at least partially overlap each other. Assuming the secondary coil 22 is viewed in a direction (z-axis direction) of a winding axis of the inductor 31, the inductor 31 and the secondary coil 22 (the region where the secondary coil 22 is formed) at least partially overlap each other. In other words, a direction (negative z-axis direction) of a magnetic flux penetrating through the inductor 31 and a direction (positive z-axis direction) of a magnetic flux penetrating through the secondary coil 22 are substantially parallel to each other. Assuming the module substrate 90 is viewed in plan, the inductor 31 overlaps the region where the secondary coil 22 is formed.

Incidentally, winding axes of the inductor and the secondary coil are defined as follows. Assuming the inductor or secondary coil is constituted by a planar coil, the winding axis thereof is an axis that is perpendicular to a plane including the planar coil and intersects a region surrounded by the planar coil. Furthermore, assuming the inductor or secondary coil is a chip component, the winding axis thereof is a winding axis of a coil formed within the component.

Here, a description that the inductor 31 at least partially overlaps the secondary coil 22 assuming the module substrate 90 is viewed in plan is defined as the fact that, assuming the module substrate 90 is viewed in plan, both line segments into which a line Li passing through a midpoint M of the inductor 31 is divided at the midpoint M intersect the secondary coil 22. Incidentally, the midpoint M of the inductor 31 is defined as an intersection point of two diagonals of the inductor 31 assuming the inductor 31 is rectangular in shape, or is defined as the barycenter of the inductor 31 assuming the inductor 31 is not rectangular in shape.

In the above-described layout and configuration of the radio-frequency module 1 according to this embodiment, assuming the module substrate 90 is viewed in plan, the inductor 31 and the region where the secondary coil 22 is formed overlap each other in the directions of their winding axes, and thus the area of the module substrate 90 can be reduced while the inductor 31 and the secondary coil 22 are coupling to each other via magnetic field coupling. Hence, the compact radio-frequency module 1 in which the number of components of the LC series resonant circuit 30 is reduced can be provided.

Incidentally, in a radio-frequency module according to the present disclosure, although the inductor 31 and the secondary coil 22 are respectively a chip inductor and a planar coil, they are not limited to these.

Figure 5B:
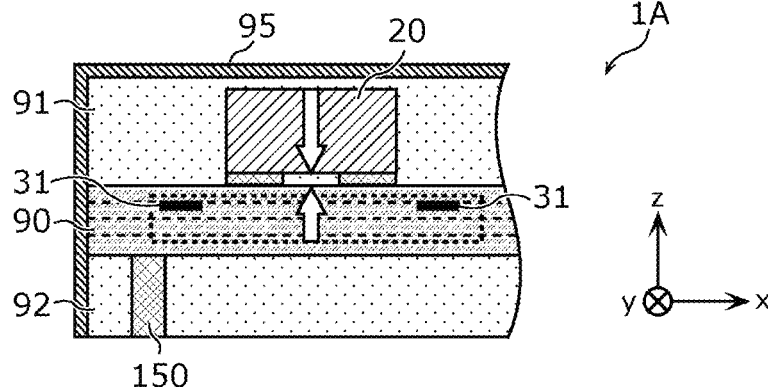
FIG. 5B is a schematic cross-sectional view of a radio-frequency module according to Modification 1 of Embodiment 1.

FIG. 5B is a schematic cross-sectional view of a radio-frequency module 1A according to Modification 1 of Embodiment 1. The radio-frequency module 1A according to this modification differs from the radio-frequency module 1 according to Embodiment 1 in mounting configurations of the inductor 31 and the secondary coil 22. As for the configuration of the radio-frequency module 1A according to this modification, a description of points in common with the radio-frequency module 1 according to Embodiment 1 is omitted, and a description will be given below with emphasis on respects in which the radio-frequency module 1A differs from the radio-frequency module 1.

As illustrated in FIG. 5B, in the radio-frequency module 1A according to this modification, the transformer 20 is disposed on the main surface of the module substrate 90. The transformer 20 is a surface-mount chip transformer disposed on the module substrate 90, and the inductor 31 is constituted by a planar coil formed in the module substrate 90. Assuming the secondary coil 22 (transformer 20) is viewed in a direction (z-axis direction) of a winding axis of the inductor 31, the secondary coil 22 and the inductor 31 at least partially overlap each other. Assuming the inductor 31 is viewed in a direction (z-axis direction) of a winding axis of the secondary coil 22 (transformer 20), the inductor 31 and the secondary coil 22 at least partially overlap each other. In other words, a direction (positive z-axis direction) of a magnetic flux penetrating through the inductor 31 and a direction (negative z-axis direction) of a magnetic flux penetrating through the secondary coil 22 are substantially parallel to each other. Assuming the module substrate 90 is viewed in plan, the secondary coil 22 (transformer 20) overlaps a region where the inductor 31 is formed.

In the above-described layout and configuration, assuming the module substrate 90 is viewed in plan, the secondary coil 22 and the region where the inductor 31 is formed overlap each other in the directions of their winding axes, and thus the area of the module substrate 90 can be reduced while the inductor 31 and the secondary coil 22 are coupling to each other via magnetic field coupling. Hence, the compact radio-frequency module 1A in which the number of components of the LC series resonant circuit 30 is reduced can be provided.

Figure 5C:
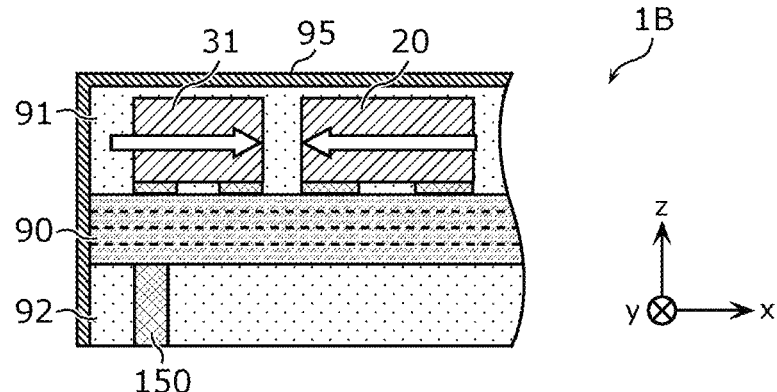
FIG. 5C is a schematic cross-sectional view of a radio-frequency module according to Modification 2 of Embodiment 1.

FIG. 5C is a schematic cross-sectional view of a radio-frequency module 1B according to Modification 2 of Embodiment 1. The radio-frequency module 1B according to this modification differs from the radio-frequency module 1 according to Embodiment 1 in mounting configurations of the inductor 31 and the secondary coil 22. As for the configuration of the radio-frequency module 1B according to this modification, a description of points in common with the radio-frequency module 1 according to Embodiment 1 is omitted, and a description will be given below with emphasis on respects in which the radio-frequency module 1B differs from the radio-frequency module 1.

As illustrated in FIG. 5C, in the radio-frequency module 1B according to this modification, the transformer 20 and the inductor 31 are disposed on the main surface of the module substrate 90. The transformer 20 is a surface-mount chip transformer disposed on the module substrate 90, and the inductor 31 is a surface-mount chip inductor disposed on the module substrate 90. Assuming the secondary coil 22 (transformer 20) is viewed in a direction (x-axis direction) of a winding axis of the inductor 31, the secondary coil 22 and the inductor 31 at least partially overlap each other. Assuming the inductor 31 is viewed in a direction (x-axis direction) of a winding axis of the secondary coil 22 (transformer 20), the inductor 31 and the secondary coil 22 at least partially overlap each other, and the inductor 31 and the transformer 20 are disposed on the module substrate 90 so as to be adjacent to each other. In other words, a direction (positive x-axis direction) of a magnetic flux penetrating through the inductor 31 and a direction (negative x-axis direction) of a magnetic flux penetrating through the secondary coil 22 are substantially parallel to each other, and the inductor 31 and the transformer 20 are disposed on the module substrate 90 so as to be adjacent to each other.

In the above-described layout and configuration, the secondary coil 22 and the inductor 31 overlap each other in the directions of their winding axes while they are disposed in proximity to each other assuming viewed in a direction (x-axis direction) parallel to the main surface of the module substrate 90, and thus the area of the module substrate 90 can be reduced while the inductor 31 and the secondary coil 22 are coupling to each other via magnetic field coupling. Hence, the compact radio-frequency module 1B in which the number of components of the LC series resonant circuit 30 is reduced can be provided.

Figure 5D:
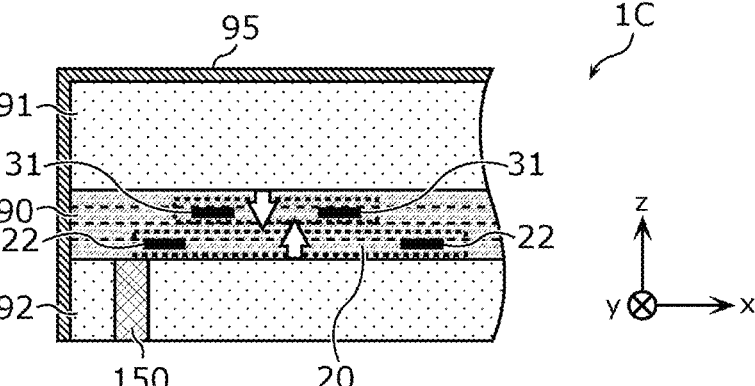
FIG. 5D is a schematic cross-sectional view of a radio-frequency module according to Modification 3 of Embodiment 1.

FIG. 5D is a schematic cross-sectional view of a radio-frequency module 1C according to Modification 3 of Embodiment 1. The radio-frequency module 1C according to this modification differs from the radio-frequency module 1 according to Embodiment 1 in mounting configurations of the inductor 31 and the secondary coil 22. As for the configuration of the radio-frequency module 1C according to this modification, a description of points in common with the radio-frequency module 1 according to Embodiment 1 is omitted, and a description will be given below with emphasis on respects in which the radio-frequency module 1C differs from the radio-frequency module 1.

As illustrated in FIG. 5D, in the radio-frequency module 1C according to this modification, the transformer 20 is constituted by a planar coil formed in the module substrate 90, and the inductor 31 is constituted by a planar coil formed in the module substrate 90. Assuming the secondary coil 22 (transformer 20) is viewed in a direction (z-axis direction) of a winding axis of the inductor 31, the secondary coil 22 and the inductor 31 at least partially overlap each other. Assuming the inductor 31 is viewed in a direction (z-axis direction) of a winding axis of the secondary coil 22 (transformer 20), the inductor 31 and the secondary coil 22 at least partially overlap each other. In other words, a direction (negative z-axis direction) of a magnetic flux penetrating through the inductor 31 and a direction (positive z-axis direction) of a magnetic flux penetrating through the secondary coil 22 are substantially parallel to each other. Assuming the module substrate 90 is viewed in plan, a region where the secondary coil 22 (transformer 20) is formed overlaps a region where the inductor 31 is formed.

In the above-described layout and configuration, assuming the module substrate 90 is viewed in plan, the region where the secondary coil 22 is formed and the region where the inductor 31 is formed overlap each other in the directions of their winding axes, and thus the area of the module substrate 90 can be reduced while the inductor 31 and the secondary coil 22 are coupling to each other via magnetic field coupling. Hence, the compact radio-frequency module 1C in which the number of components of the LC series resonant circuit 30 is reduced can be provided.

1.4 Effects

As described above, the radio-frequency module 1 according to this embodiment includes the amplifiers 11 and 12, the transformer 20 including the primary coil 21 and the secondary coil 22, the antenna connection terminal 100, the inductor 31 disposed in series between the one end of the secondary coil 22 and the antenna connection terminal 100, and the capacitor 42 connected between the path connecting the one end of the secondary coil 22 and the inductor 31 and the ground. The one end of the primary coil 21 is connected to the output end of the amplifier 11, the other end of the primary coil 21 is connected to the output end of the amplifier 12, the other end of the secondary coil 22 is connected to the ground, and the secondary coil 22 and the inductor 31 are coupled to each other via magnetic field coupling.

As a result, assuming the secondary coil 22 and the inductor 31 couple to each other via magnetic field coupling, the mutual inductance component 32 is newly generated between the node n1 disposed between the secondary coil 22 and the inductor 31 and the capacitor 42. Assuming the mutual inductance component 32 is added to the node n1, the mutual inductance component 32 is added in series to the capacitor 42, and the capacitor 42 constitutes the LC series resonant circuit 30 connected between the node n1 and the ground. In the LC series resonant circuit 30, impedance reaches a minimum at the resonant frequency of the LC series resonant circuit 30, and thus, in bandpass characteristics of a radio-frequency signal that is transmitted from the one end of the secondary coil 22 to the antenna connection terminal 100, an attenuation pole can be formed at the above-described resonant frequency. Because of this, a predetermined frequency band of a radio-frequency signal that is transmitted by the radio-frequency module 1 can be attenuated. At this time, the LC series resonant circuit 30 can be formed, with no inductor for the LC series resonant circuit 30 being disposed, by using the secondary coil 22 disposed to combine signals and the inductor 31 disposed to provide impedance matching, and thus the radio-frequency module 1 in which the number of components of the LC series resonant circuit 30 is reduced can be provided.

Furthermore, for example, the radio-frequency module 1 according to this embodiment includes the amplifiers 11 and 12, the transformer 20 including the primary coil 21 and the secondary coil 22, the antenna connection terminal 100, the inductor 31 disposed in series between the one end of the secondary coil 22 and the antenna connection terminal 100, and the capacitor 42 connected between the path connecting the one end of the secondary coil 22 and the inductor 31 and the ground. The one end of the primary coil 21 is connected to the output end of the amplifier 11, the other end of the primary coil 21 is connected to the output end of the amplifier 12, the other end of the secondary coil 22 is connected to the ground, and the secondary coil 22 and the inductor 31 are disposed so as to be adjacent to each other. Assuming the inductor 31 is viewed in a direction of the winding axis of the secondary coil 22, the secondary coil 22 and the inductor 31 at least partially overlap each other. Assuming the secondary coil 22 is viewed in a direction of the winding axis of the inductor 31, the inductor 31 and the secondary coil 22 at least partially overlap each other.

As a result, the secondary coil 22 and the inductor 31 couple to each other via magnetic field coupling. Because of this, the mutual inductance component 32 is newly generated between the node n1 disposed between the secondary coil 22 and the inductor 31 and the capacitor 42. Assuming the mutual inductance component 32 is added to the node n1, the mutual inductance component 32 is added in series to the capacitor 42, and the capacitor 42 constitutes the LC series resonant circuit 30 connected between the node n1 and the ground. At this time, the LC series resonant circuit 30 can be formed, with no inductor for the LC series resonant circuit 30 being disposed, by using the secondary coil 22 disposed to combine signals and the inductor 31 disposed to provide impedance matching, and thus the radio-frequency module 1 in which the number of components of the LC series resonant circuit 30 is reduced can be provided.

Furthermore, for example, in the radio-frequency module 1, the capacitor 42 is connected to the node n1 on the above-described path, and there are no inductors connected between the node n1 and the capacitor 42 and between the capacitor 42 and the ground.

As a result, the mutual inductance component 32 generated by magnetic field coupling is not an inductance component of an inductor that really exists in the circuit, and thus the number of components of the LC series resonant circuit 30 can be reduced.

Furthermore, for example, in the radio-frequency module 1, the secondary coil 22 and the inductor 31 are coupled to each other in opposite polarity via magnetic field coupling.

As a result, an attenuation pole can be formed at a resonant frequency of the LC series resonant circuit 30.

Furthermore, for example, in the radio-frequency module 1, in bandpass characteristics of a radio-frequency signal from the one end of the secondary coil 22 to the antenna connection terminal 100, an attenuation pole corresponding to LC series resonance that occurs due to the mutual inductance component 32 generated by magnetic field coupling between the secondary coil 22 and the inductor 31 and the capacitor 42 is formed.

As a result, the number of components of the LC series resonant circuit 30 can be reduced.

Furthermore, for example, the radio-frequency module 1 further includes the module substrate 90. The secondary coil 22 is a planar coil formed in the module substrate 90, and the inductor 31 is a chip inductor disposed on the module substrate 90.

As a result, the secondary coil 22 and the inductor 31 couple to each other via magnetic field coupling.

Furthermore, for example, in the radio-frequency module 1C, the inductor 31 is a planar coil formed in the module substrate 90, and the transformer 20 is a planar coil formed in the module substrate 90.

As a result, the secondary coil 22 and the inductor 31 couple to each other via magnetic field coupling.

Furthermore, for example, in the radio-frequency module 1A according to Modification 1 of this embodiment, the inductor 31 is a planar coil formed in the module substrate 90, and the transformer 20 is a chip transformer disposed on the module substrate 90.

As a result, the secondary coil 22 and the inductor 31 couple to each other via magnetic field coupling.

Furthermore, for example, in the radio-frequency module 1B according to Modification 2 of this embodiment, the inductor 31 is a chip inductor formed on the module substrate 90, the transformer 20 is a chip transformer disposed on the module substrate 90, and the inductor 31 and the transformer 20 are disposed on the module substrate 90 so as to be adjacent to each other.

As a result, the secondary coil 22 and the inductor 31 couple to each other via magnetic field coupling.

Furthermore, the communication device 4 according to this embodiment includes the RFIC 3 that processes a radio-frequency signal, and the radio-frequency module 1 that transmits the radio-frequency signal between the RFIC 3 and the antenna 2.

As a result, the effects of the radio-frequency module 1 can be achieved by the communication device 4.

Embodiment 2

2. Configuration of Radio-Frequency Module and Communication Device

Figure 6:
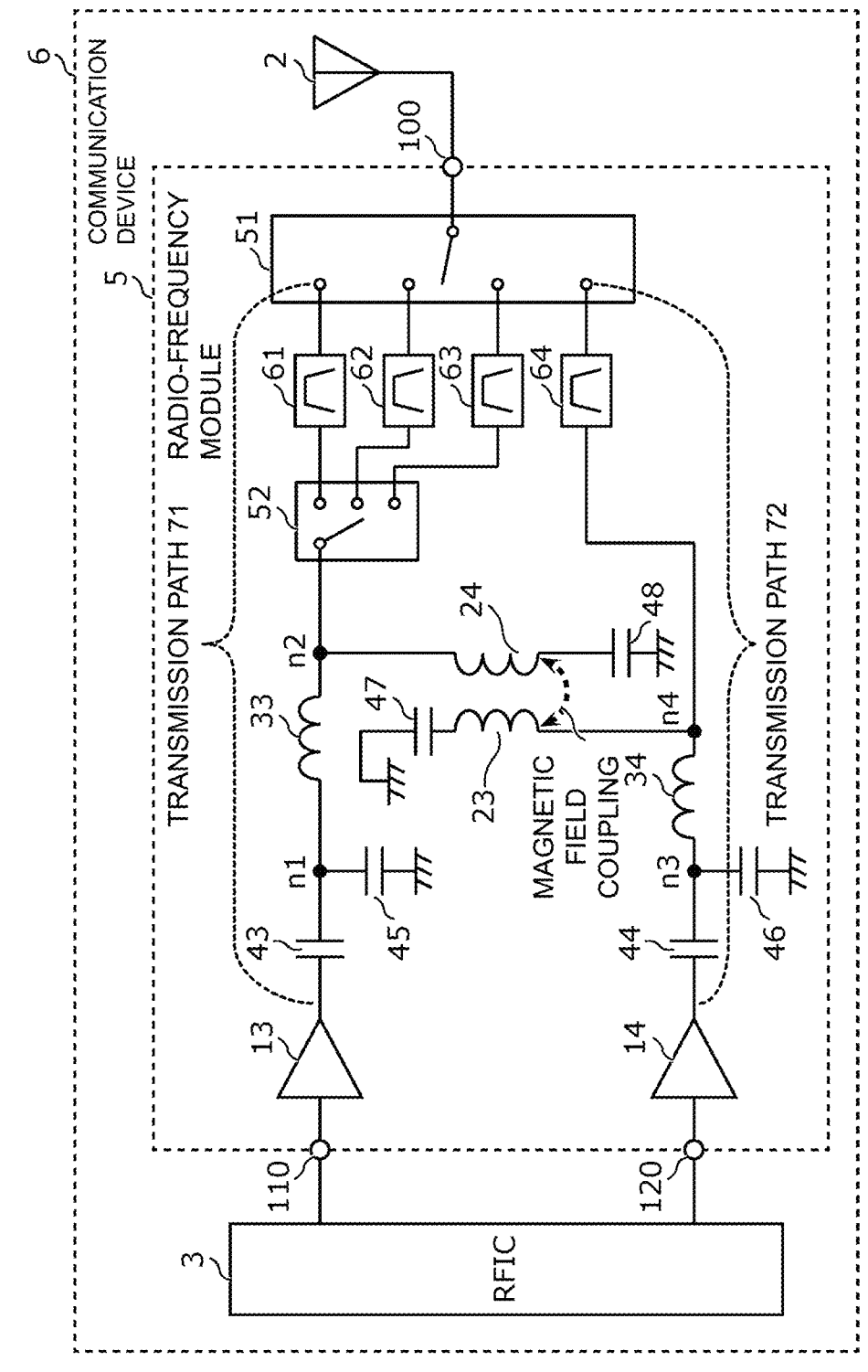
FIG. 6 is a circuit configuration diagram of a radio-frequency module and a communication device according to Embodiment 2.

A circuit configuration of a radio-frequency module 5 and a communication device 6 according to this embodiment will be described with reference to FIG. 6. FIG. 6 is a circuit configuration diagram of the radio-frequency module 5 and the communication device 6 according to Embodiment 2.

2.1 Circuit Configuration of Communication Device 6]

First, the circuit configuration of the communication device 6 will be described. As illustrated in FIG. 6, the communication device 6 according to this embodiment includes the radio-frequency module 5, the antenna 2, and the RFIC 3.

The radio-frequency module 5 transmits a radio-frequency signal between the antenna 2 and the RFIC 3. The detailed circuit configuration of the radio-frequency module 5 will be described later.

The antenna 2 is connected to the antenna connection terminal 100 of the radio-frequency module 5 and transmits a radio-frequency signal output from the radio-frequency module 5. Incidentally, the antenna 2 may receive a radio-frequency signal from the outside and output the radio-frequency signal to the radio-frequency module 5.

The RFIC 3 is an example of a signal processing circuit that processes a radio-frequency signal. Specifically, the RFIC 3 performs, for example, through up-conversion, signal processing on a transmission signal input from a baseband signal processing circuit (BBIC, which is not illustrated) and outputs a transmission signal generated through the signal processing to a transmission path of the radio-frequency module 5. Incidentally, the RFIC 3 may perform, for example, through down-conversion, signal processing on a reception signal input through a reception path of the radio-frequency module 5 and output a reception signal generated through the signal processing to the BBIC.

Furthermore, the RFIC 3 also functions as a control unit that controls a power-supply voltage and a bias voltage (current) that are to be supplied to amplifiers included in the radio-frequency module 5. Additionally, the RFIC 3 also functions as the control unit that controls connections of switches 51 and 52 included in the radio-frequency module 5 in accordance with a band (frequency band) that is used. Incidentally, some or all of functions of the RFIC 3 as the control unit may be implemented outside the RFIC 3 and may be implemented, for example, in the BBIC or radio-frequency module 5.

Incidentally, in the communication device 6 according to this embodiment, the antenna 2 is not an indispensable component.

2.2 Circuit Configuration of Radio-Frequency Module 5

Next, the circuit configuration of the radio-frequency module 5 will be described. As illustrated in FIG. 6, the radio-frequency module 5 includes amplifiers 13 and 14, inductors 23, 24, 33, and 34, capacitors 43, 44, 45, 46, 47, and 48, filters 61, 62, 63, and 64, the switches 51 and 52, the antenna connection terminal 100, and the signal input terminals 110 and 120.

The antenna connection terminal 100 is an example of an output terminal and is connected to the filters 61 to 64 via the switch 51. The signal input terminal 110 is connected to the RFIC 3 and the amplifier 13. The signal input terminal 120 is connected to the RFIC 3 and the amplifier 14.

The amplifier 13 is an example of a first amplifier, an input end thereof is connected to the signal input terminal 110, and an output end thereof is connected to the filters 61 to 63 via the capacitor 43, the inductor 33, and the switch 52. The amplifier 13 amplifies a transmission signal of a first frequency band group input from the signal input terminal 110. In this embodiment, the amplifier 13 is a power amplifier.

The amplifier 14 is an example of a second amplifier, an input end thereof is connected to the signal input terminal 120, and an output end thereof is connected to the filter 64 via the capacitor 44 and the inductor 34. The amplifier 14 amplifies a transmission signal of a second frequency band group input from the signal input terminal 120. In this embodiment, the amplifier 14 is a power amplifier.

Each of the amplifiers 13 and 14 includes an amplifier transistor. The above-described amplifier transistor is, for example, a bipolar transistor, such as an HBT, or a field-effect transistor, such as a MOSFET.

Incidentally, the first frequency band group is, for example, a mid-band group (1427 to 2200 MHz), and the second frequency band group is, for example, a high-band group (2300 to 2690 MHz).

The capacitor 43 is disposed in series in a transmission path 71 connecting the output end of the amplifier 13 and the switch 51 and is a circuit component for keeping a direct current to be supplied to the amplifier 13 from flowing to the transmission path 71. The capacitor 44 is disposed in series in a transmission path 72 connecting the output end of the amplifier 14 and the switch 51 and is a circuit component for keeping a direct current to be supplied to the amplifier 14 from flowing to the transmission path 72.

The capacitor 45 is an example of a third capacitor and is connected between the node n1 between the capacitor 43 and the inductor 33 in the transmission path 71 and the ground. The capacitor 46 is an example of a fourth capacitor and is connected between a node n3 between the capacitor 44 and the inductor 34 in the transmission path 72 and the ground.

The inductor 33 is an example of a third inductor and is disposed in series in a path between the capacitor 43 and the switch 52 in the transmission path 71. The inductor 34 is an example of a fourth inductor and is disposed in series in a path between the capacitor 44 and the filter 64 in the transmission path 72.

The inductor 33 and the capacitor 45 constitute a first matching network. The first matching network is connected to the transmission path 71 and provides impedance matching between the amplifier 13 and the filters 61 to 63.

The inductor 34 and the capacitor 46 constitute a second matching network. The second matching network is connected to the transmission path 72 and provides impedance matching between the amplifier 14 and the filter 64.

Incidentally, the first matching network is not limited to the configuration where the inductor 33 is disposed in series in the transmission path 71 and the capacitor 45 is connected in shunt with the transmission path 71. The first matching network includes at least one inductor and at least one capacitor and is connected to the transmission path 71. Furthermore, the second matching network is not limited to the configuration where the inductor 34 is disposed in series in the transmission path 72 and the capacitor 46 is connected in shunt with the transmission path 72. The second matching network only includes at least one inductor and at least one capacitor and is connected to the transmission path 72.

The inductor 24 is an example of a first inductor and is connected between a node n2 (first node) between the inductor 33 and the switch 52 on the transmission path 71 and the ground. The capacitor 48 is an example of a first capacitor and is connected between the node n2 and the ground. The inductor 24 and the capacitor 48 are connected in series with each other and constitute a first LC series resonant circuit. That is, the first LC series resonant circuit is connected between the transmission path 71 and the ground. Owing to resonance characteristics of the first LC series resonant circuit, in bandpass characteristics of the transmission path 71, an attenuation pole can be formed in a band on a lower frequency side than the first frequency band group.

The inductor 23 is an example of a second inductor and is connected between a node n4 (second node) between the inductor 34 and the filter 64 on the transmission path 72 and the ground. The capacitor 47 is an example of a second capacitor and is connected between the node n4 and the ground. The inductor 23 and the capacitor 47 are connected in series with each other and constitute a second LC series resonant circuit. That is, the second LC series resonant circuit is connected between the transmission path 72 and the ground. Owing to resonance characteristics of the second LC series resonant circuit, in bandpass characteristics of the transmission path 72, an attenuation pole can be formed in a band on a lower frequency side than the second frequency band group.

In the above-described configuration, the inductor 23 and the inductor 24 are coupled to each other via magnetic field coupling.

The filter 61 is connected between the switches 51 and 52 and includes, in a pass band, a band A belonging to the first frequency band group. The filter 62 is connected between the switches 51 and 52 and includes, in a pass band, a band B belonging to the first frequency band group. The filter 63 is connected between the switches 51 and 52 and includes, in a pass band, a band C belonging to the first frequency band group. The filter 64 is connected between the switch 51 and the node n4 and includes, in a pass band, a band D belonging to the second frequency band group.

Incidentally, in this embodiment, each of the band A to the band D refers to a frequency band pre-defined, for example, by a standards body (such as the 3rd Generation Partnership Project (3GPP) (registered trademark), the Institute of Electrical and Electronics Engineers (IEEE), or the like) for a communication system constructed by using radio access technology (RAT). In this embodiment, examples of a communication system that can be used include a 4th Generation (4G)-Long Term Evolution (LTE) system, a 5th Generation (5G)-New Radio (NR) system, and a Wireless Local Area Network (WLAN) system, but the communication system is not limited to these.

The switch 52 is connected between the inductor 33 and the filters 61 to 63 and switches the connection of the amplifier 13 between the filters 61 to 63. The switch 51 is connected between the filters 61 to 64 and the antenna connection terminal 100 and switches a connection between at least one of the filters 61 to 64 and the antenna connection terminal 100 to another connection.

Incidentally, the radio-frequency module 5 according to this embodiment does not have to include the capacitors 43 and 44, the switches 51 and 52, and at least one of the filters 61 to 64.

Figure 7A:
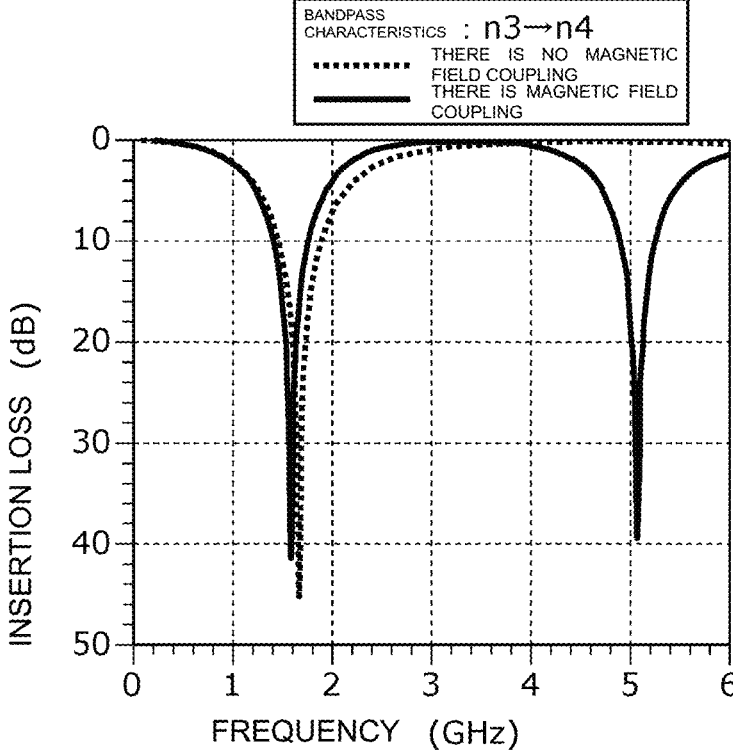
FIG. 7A is a graph illustrating bandpass characteristics of radio-frequency modules according to Embodiment 2 and a comparative example.
Figure 7B:
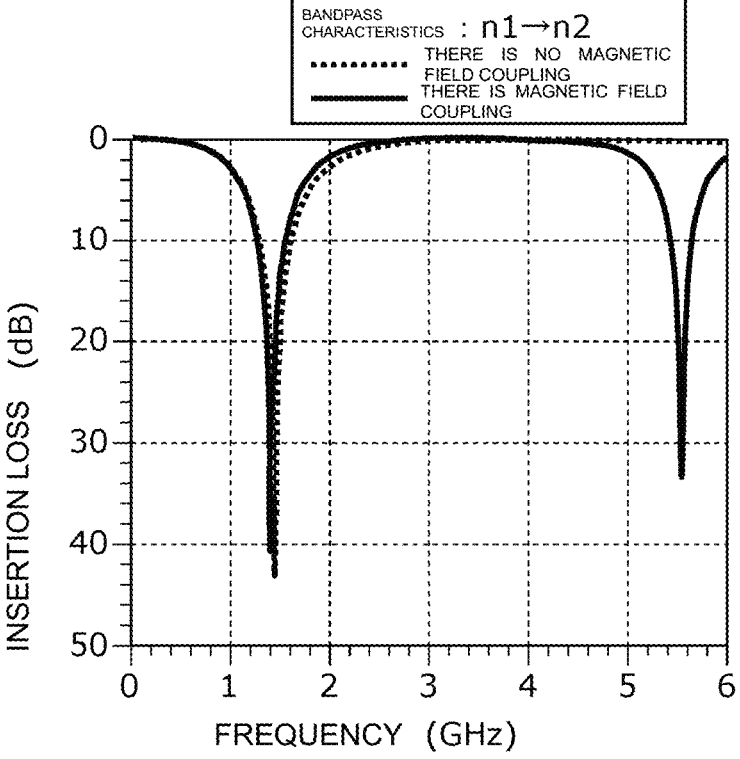
FIG. 7B is a graph illustrating bandpass characteristics of the radio-frequency modules according to Embodiment 2 and the comparative example.

FIGS. 7A and 7B are graphs illustrating bandpass characteristics of radio-frequency modules according to Embodiment 2 and a comparative example. FIG. 7A illustrates node n3-node n4 bandpass characteristics of the transmission path 72, and FIG. 7B illustrates node n1-node n2 bandpass characteristics of the transmission path 71.

Incidentally, the radio-frequency module according to the comparative example is the same in circuit connection configuration as the radio-frequency module 5 according to this embodiment but differs from the radio-frequency module 5 in that the inductor 23 and the inductor 24 are not coupled to each other via magnetic field coupling.

First, in FIG. 7A, in the radio-frequency module according to the comparative example (there is no magnetic field coupling), in node n3-node n4 bandpass characteristics, an attenuation pole is formed in a band (1.6 to 1.8 GHz) on a low-frequency side of the second frequency band group (2300 to 2690 MHz). This is caused by resonance characteristics of the second LC series resonant circuit, and the frequency of the above-described attenuation pole corresponds to a resonant frequency of the second LC series resonant circuit.

On the other hand, in the radio-frequency module 5 according to this embodiment (there is magnetic field coupling), in node n3-node n4 bandpass characteristics, a first attenuation pole is formed in a band (1.5 to 1.6 GHz) on the low-frequency side of the second frequency band group, and a second attenuation pole is also formed in a second harmonic band (5.0 to 5.1 GHz) of the second frequency band group. The first attenuation pole is caused by resonance characteristics of the second LC series resonant circuit, and the frequency of the first attenuation pole corresponds to a resonant frequency of the second LC series resonant circuit. On the other hand, owing to magnetic field coupling between the inductors 23 and 24, a third LC series resonant circuit constituted by the inductors 23, 24, and 33, and the capacitor 45 is regarded as being connected between the node n4 in the transmission path 72 and the ground. The second attenuation pole is caused by resonance characteristics of this third LC series resonant circuit, and the frequency of the second attenuation pole corresponds to a resonant frequency of the third LC series resonant circuit.

That is, the third LC series resonant circuit is formed, without any inductor and any capacitor that constitute the third LC series resonant circuit for forming the second attenuation pole being newly disposed, by using the first matching network disposed in the other transmission path to provide impedance matching. Hence, the number of components of the LC resonant circuit for generating the new second attenuation pole can be reduced.

Next, in FIG. 7B, in the radio-frequency module according to the comparative example (there is no magnetic field coupling), in node n1-node n2 bandpass characteristics, an attenuation pole is formed in a band (1.3 to 1.4 GHz) on a low-frequency side of the first frequency band group (1427 to 2200 MHz). This is caused by resonance characteristics of the first LC series resonant circuit, and the frequency of the above-described attenuation pole corresponds to a resonant frequency of the first LC series resonant circuit.

On the other hand, in the radio-frequency module 5 according to this embodiment (there is magnetic field coupling), in node n1-node n2 bandpass characteristics, a third attenuation pole is formed in the band (1.3 to 1.4 GHz) on the low-frequency side of the first frequency band group, and a fourth attenuation pole is also formed in a third harmonic band (5.5 to 5.6 GHz) of the first frequency band group. The third attenuation pole is caused by resonance characteristics of the first LC series resonant circuit, and the frequency of the third attenuation pole corresponds to a resonant frequency of the first LC series resonant circuit. On the other hand, owing to magnetic field coupling between the inductors 23 and 24, a fourth LC series resonant circuit constituted by the inductors 23, 24, and 34, and the capacitor 46 is regarded as being connected between the node n2 in the transmission path 71 and the ground. The fourth attenuation pole is caused by resonance characteristics of this fourth LC series resonant circuit, and the frequency of the fourth attenuation pole corresponds to a resonant frequency of the fourth LC series resonant circuit.

That is, the fourth LC series resonant circuit is formed, without any inductor and any capacitor that constitute the fourth LC series resonant circuit for forming the fourth attenuation pole being newly disposed, by using the second matching network disposed in the other transmission path to provide impedance matching. Hence, the number of components of the LC resonant circuit for generating the new fourth attenuation pole can be reduced.

2.3 Layout and Configuration of Components of Radio-Frequency Module 5

Next, the layout and configuration of components of the radio-frequency module 5 will be described.

Figure 8:
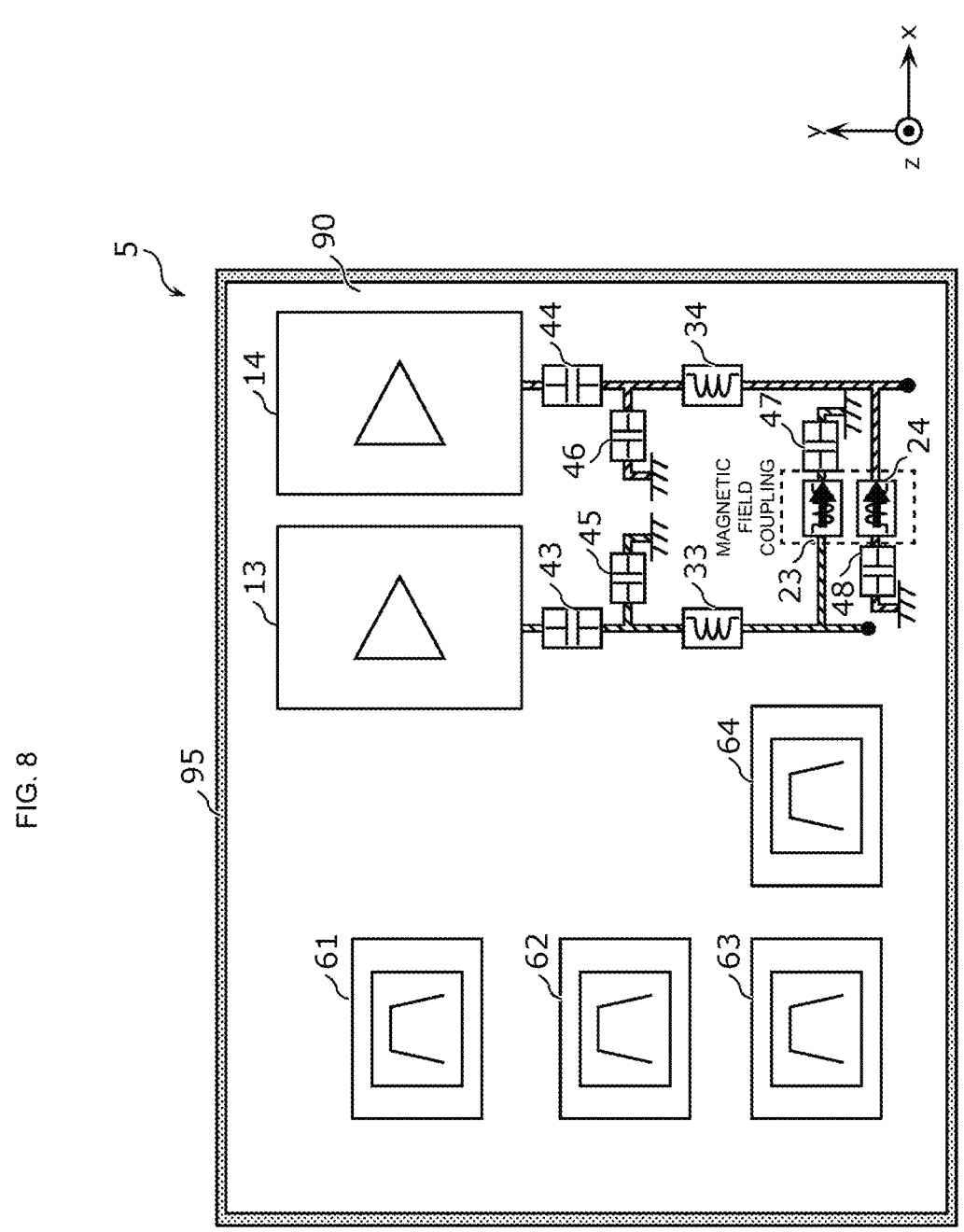
FIG. 8 is a schematic plan view of the radio-frequency module according to Embodiment 2.

FIG. 8 is a schematic plan view of the radio-frequency module 5 according to Embodiment 2. As illustrated in FIG. 8, in the radio-frequency module 5 according to this embodiment, the inductors 23, 24, 33, and 34, the capacitors 43 to 48, the amplifiers 13 and 14, and the filters 61 to 64 are disposed on the main surface of the module substrate 90. Furthermore, lines connecting these circuit components are formed in or on the module substrate 90. Additionally, the radio-frequency module 5 may include the shield electrode layer 95 formed so as to cover these circuit components and sides of the module substrate 90.

The inductors 23 and 24 are surface-mount chip inductors disposed on the module substrate 90 and are disposed so as to be adjacent to each other. Furthermore, a direction (x-axis direction) of a winding axis of the inductor 23 and a direction (x-axis direction) of a winding axis of the inductor 24 are substantially parallel to each other. In other words, a direction (positive x-axis direction) of a magnetic flux penetrating through the inductor 23 and a direction (positive x-axis direction) of a magnetic flux penetrating through the inductor 24 are substantially parallel to each other.

In the above-described layout and configuration of the radio-frequency module 5 according to this embodiment, the inductors 23 and 24 are disposed so as to be adjacent to each other, the directions of their winding axes are substantially parallel to each other, and thus the inductors 23 and 24 couple to each other via magnetic field coupling. Hence, the compact radio-frequency module 5 in which the number of components is reduced can be provided.

Incidentally, at least one of the inductors 23 and 24 may be constituted by a planar coil formed in or on the module substrate 90. In this case, it is desirable that, assuming the inductor 24 is viewed in a direction of a winding axis of the inductor 23, the inductor 23 and the inductor 24 at least partially overlap each other, and that, assuming the inductor 23 is viewed in a direction of a winding axis of the inductor 24, the inductor 24 and the inductor 23 at least partially overlap each other.

2.4 Circuit Configuration of Radio-Frequency Module 5A According to Modification Next, the circuit configuration of a radio-frequency module 5A according to a modification will be described.

Figure 9:
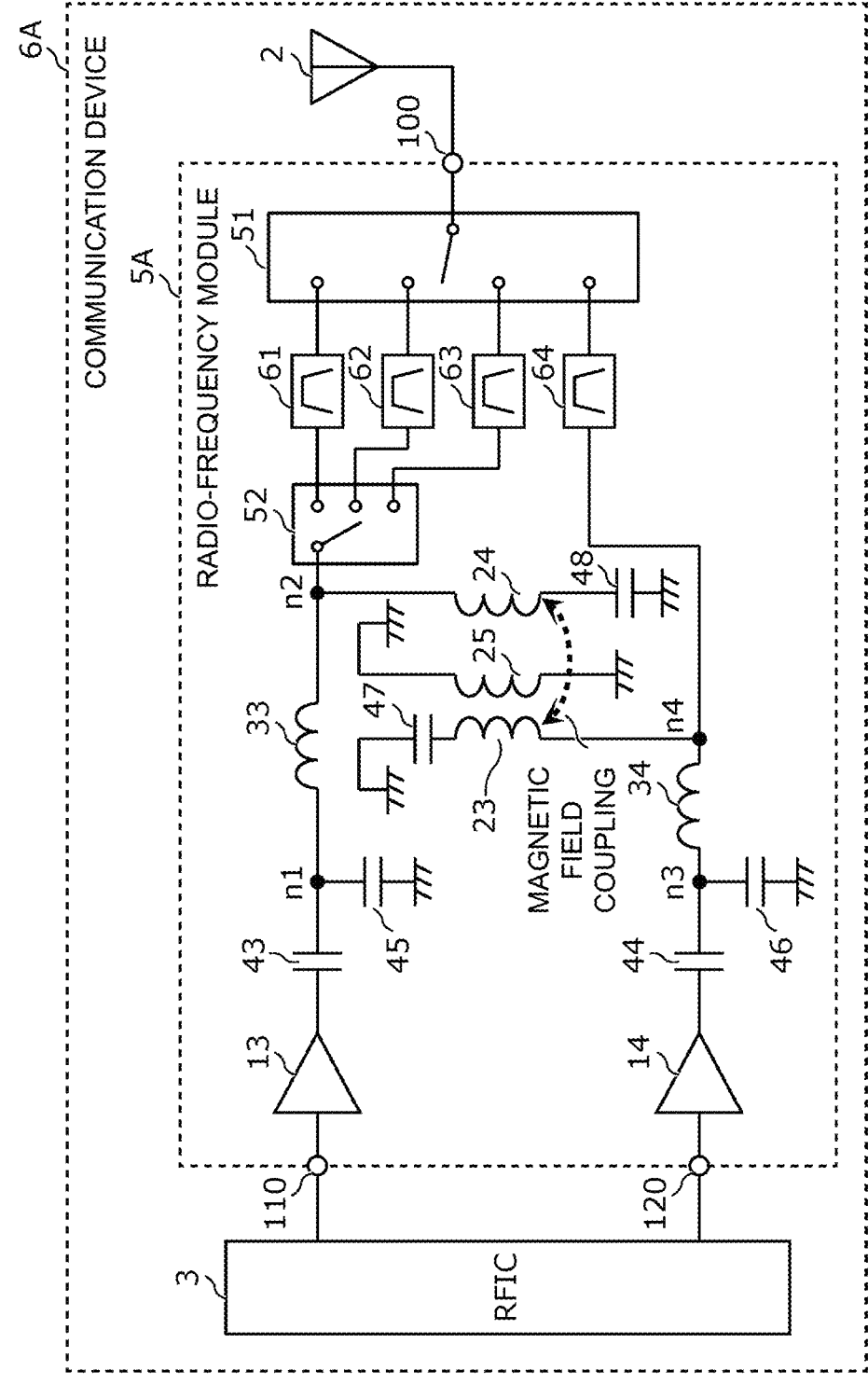
FIG. 9 is a circuit configuration diagram of a radio-frequency module and a communication device according to a modification of Embodiment 2.

FIG. 9 is a circuit configuration diagram of the radio-frequency module 5A and a communication device 6A according to the modification of Embodiment 2. As illustrated in FIG. 9, the communication device 6A includes the radio-frequency module 5A, the antenna 2, and the RFIC 3. The communication device 6A according to the present modification differs from the communication device 6 according to Embodiment 2 in the configuration of the radio-frequency module 5A. Hence, the circuit configuration of the radio-frequency module 5A will be described below.

The radio-frequency module 5A includes the amplifiers 13 and 14, inductors 23, 24, 25, 33, and 34, the capacitors 43, 44, 45, 46, 47, and 48, the filters 61, 62, 63, and 64, the switches 51 and 52, the antenna connection terminal 100, and the signal input terminals 110 and 120. The radio-frequency module 5A according to the present modification differs from the radio-frequency module 5 according to Embodiment 2 in that the inductor 25 is included. As for the configuration of the radio-frequency module 5A according to the present modification, a description of points in common with the radio-frequency module 5 according to Embodiment 2 is omitted, and a description will be given below with emphasis on respects in which the radio-frequency module 5A differs from the radio-frequency module 5.

The inductor 25 is an example of a fifth inductor and is disposed between the inductor 23 and the inductor 24, and both ends thereof are connected to the ground.

As a result, the inductor 25 is disposed between the inductors 23 and 24 that couple to each other via magnetic field coupling, and thus magnetic field coupling between the inductors 23 and 24 can be strengthened.

2.5 Layout and Configuration of Components of Radio-Frequency Module 5A According to Modification Next, the layout and configuration of components of the radio-frequency module 5A will be described.

Figure 10:
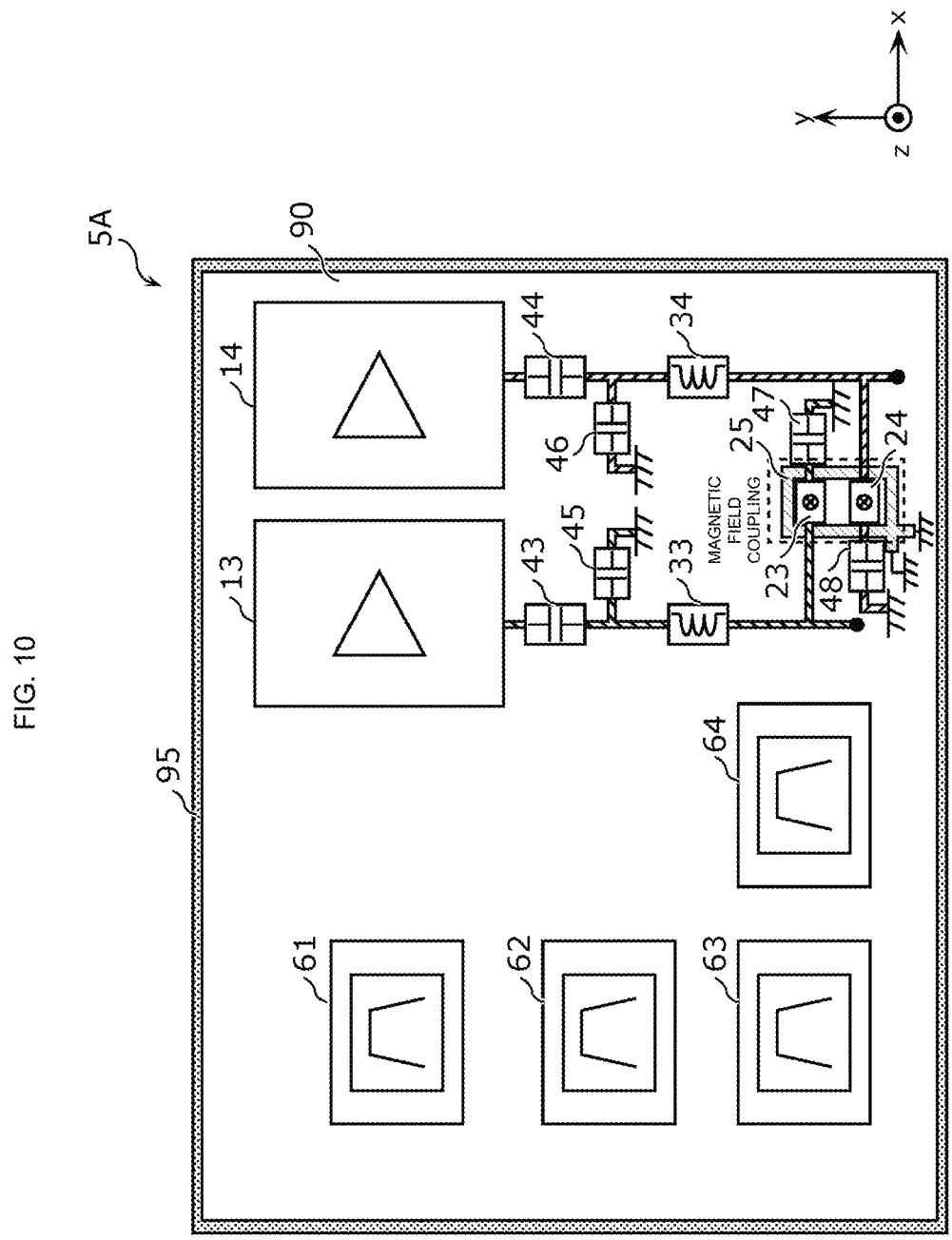
FIG. 10 is a schematic plan view of the radio-frequency module according to the modification of Embodiment 2.

FIG. 10 is a schematic plan view of the radio-frequency module 5A according to Modification of Embodiment 2. As illustrated in FIG. 10, in the radio-frequency module 5A according to this Modification of embodiment, the inductors 23, 24, 33, and 34, the capacitors 43 to 48, the amplifiers 13 and 14, and the filters 61 to 64 are disposed on the main surface of the module substrate 90. Furthermore, the inductor 25 is disposed on the main surface or inside of the module substrate 90.

The inductors 23 and 24 are surface-mount chip inductors disposed on the module substrate 90 and are disposed so as to be adjacent to each other. Furthermore, a direction (z-axis direction) of a winding axis of the inductor 23 and a direction (z-axis direction) of a winding axis of the inductor 24 are substantially parallel to each other and are substantially perpendicular to the main surface of the module substrate 90. In other words, a direction (negative z-axis direction) of a magnetic flux penetrating through the inductor 23 and a direction (negative z-axis direction) of a magnetic flux penetrating through the inductor 24 are substantially parallel to each other.

Furthermore, assuming the main surface of the module substrate 90 is viewed in plan, the inductor 25 is a planar coil disposed so as to be adjacent to the inductors 23 and 24 and surround the inductors 23 and 24 and is connected to the ground.

In the above-described layout and configuration, the inductors 23 and 24 couple to each other via magnetic field coupling with the inductor 25 interposed therebetween, and thus magnetic field coupling between the inductors 23 and 24 can be strengthened. Furthermore, even assuming the inductors 23 and 24 are not disposed in proximity to each other, magnetic field coupling can be provided with the inductor 25 interposed therebetween, and thus a distance between the inductors 23 and 24 can be increased.

2.6 Effects

As described above, the radio-frequency module 5 according to this embodiment includes the amplifiers 13 and 14, the antenna connection terminal 100, a first LC series circuit including the inductor 24 and the capacitor 48 connected in series with each other, a second LC series circuit including the inductor 23 and the capacitor 47 connected in series with each other, the first matching network including the inductor 33 and the capacitor 45, and the second matching network including the inductor 34 and the capacitor 46. The first LC series circuit is connected between the transmission path 71 connecting the output end of the amplifier 13 and the antenna connection terminal 100 and the ground, the second LC series circuit is connected between the transmission path 72 connecting the output end of the amplifier 14 and the antenna connection terminal 100 and the ground, the first matching network is connected to the transmission path 71, the second matching network is connected to the transmission path 72, and the inductor 23 and the inductor 24 are coupled to each other via magnetic field coupling.

As a result, in bandpass characteristics of the transmission path 71, the third attenuation pole is formed in a band on the low-frequency side of the first frequency band group, and the fourth attenuation pole is also formed in the third harmonic band of the first frequency band group. The third attenuation pole is caused by resonance characteristics of the first LC series resonant circuit. On the other hand, owing to magnetic field coupling between the inductors 23 and 24, the fourth LC series resonant circuit constituted by the inductors 23, 24, and 34, and the capacitor 46 is regarded as being connected between the transmission path 71 and the ground. The fourth attenuation pole is caused by resonance characteristics of this fourth LC series resonant circuit. That is, the fourth LC series resonant circuit is formed, without any inductor and any capacitor that constitute the fourth LC series resonant circuit for forming the fourth attenuation pole being newly disposed, by using the second matching network disposed in the other transmission path to provide impedance matching. Hence, the number of components of the LC resonant circuit for generating the new fourth attenuation pole can be reduced.

Furthermore, in bandpass characteristics of the transmission path 72, the first attenuation pole is formed in a band on the low-frequency side of the second frequency band group, and the second attenuation pole is also formed in the second harmonic band of the second frequency band group. The first attenuation pole is caused by resonance characteristics of the second LC series resonant circuit. On the other hand, owing to magnetic field coupling between the inductors 23 and 24, the third LC series resonant circuit constituted by the inductors 23, 24, and 33, and the capacitor 45 is regarded as being connected between the transmission path 72 and the ground. The second attenuation pole is caused by resonance characteristics of this third LC series resonant circuit. That is, the third LC series resonant circuit is formed, without any inductor and any capacitor that constitute the third LC series resonant circuit for forming the second attenuation pole being newly disposed, by using the first matching network disposed in the other transmission path to provide impedance matching. Hence, the number of components of the LC resonant circuit for generating the new second attenuation pole can be reduced.

Furthermore, for example, in the radio-frequency module 5, the inductor 23 and the inductor 24 are disposed so as to be adjacent to each other, and a winding axis of the inductor 23 and a winding axis of the inductor 24 are parallel to each other.

As a result, the inductor 23 and the inductor 24 couple to each other via magnetic field coupling.

Furthermore, for example, in the radio-frequency module 5, the inductor 33 is disposed in series between the node n2 (first node) on the transmission path 71 and the output end of the amplifier 13, the capacitor 45 is connected between a path connecting the output end of the amplifier 13 and the inductor 33 and the ground, the inductor 34 is disposed in series between the node n4 (second node) on the transmission path 72 and the output end of the amplifier 14, and the capacitor 46 is connected between a path connecting the output end of the amplifier 14 and the inductor 34 and the ground.

As a result, in the fourth LC series resonant circuit, an LC series circuit including the inductor 34 and the capacitor 46 can be used effectively, and, in the third LC series resonant circuit, an LC series circuit including the inductor 33 and the capacitor 45 can be used effectively.

Furthermore, for example, the radio-frequency module 5A according to the modification of this embodiment further includes the inductor 25 disposed between the inductor 23 and the inductor 24 and having both ends connected to the ground.

As a result, the inductor 25 is disposed between the inductors 23 and 24 that couple to each other via magnetic field coupling, and thus magnetic field coupling between the inductors 23 and 24 can be strengthened.

Furthermore, for example, the radio-frequency module 5A further includes the module substrate 90, the inductors 23 and 24 are disposed so that respective winding axes are perpendicular to the main surface of the module substrate 90, and the inductor 25 is a ground coil formed in or on the module substrate 90 so as to be adjacent to the inductors 23 and 24 and surround the inductors 23 and 24 assuming the main surface of the module substrate 90 is viewed in plan.

As a result, the inductors 23 and 24 couple to each other via magnetic field coupling with the inductor 25 interposed therebetween, and thus magnetic field coupling between the inductors 23 and 24 can be strengthened. Furthermore, even assuming the inductors 23 and 24 are not disposed in proximity to each other, magnetic field coupling can be provided, and thus a distance between the inductors 23 and 24 can be increased.

Furthermore, the communication device 6 according to this embodiment includes the RFIC 3 that processes a radio-frequency signal, and the radio-frequency module 5 that transmits the radio-frequency signal between the RFIC 3 and the antenna 2.

As a result, the effects of the radio-frequency module 5 can be achieved by the communication device 6.

OTHER EMBODIMENTS

Although radio-frequency modules and communication devices according to one or more embodiments of the present disclosure have been described above with embodiments and modifications, a radio-frequency module and a communication device according to the present disclosure are not limited to the above-described embodiments and modifications. The present disclosure also encompasses another embodiment achieved by combining any components in the above-described embodiments and modifications, modifications obtained by making various modifications conceived by a person skilled in the art to the above-described embodiments and modifications within the scope of the gist of the present disclosure, and various devices including the above-described radio-frequency modules and communication devices.

For example, in the radio-frequency modules and the communication devices according to the above-described embodiments and modifications, another circuit element, a line, and so forth may be inserted between paths connecting circuit elements and signal paths that are illustrated in the drawings.

Features of the radio-frequency module and the communication device that have been described by using each of the above-described embodiments will be described below.

<1>
A radio-frequency module comprising:
a first amplifier and a second amplifier;
a transformer including a primary coil and a secondary coil;
an output terminal;
a first inductor disposed in series between one end of the secondary coil and the output terminal; and
a first capacitor connected between a path connecting the one end and the first inductor and a ground,
wherein one end of the primary coil is connected to an output end of the first amplifier,
wherein another end of the primary coil is connected to an output end of the second amplifier,
wherein another end of the secondary coil is connected to the ground, and
wherein the secondary coil and the first inductor are coupled to each other via magnetic field coupling.

<2>
A radio-frequency module comprising:
a first amplifier and a second amplifier;
a transformer including a primary coil and a secondary coil;
an output terminal;
a first inductor disposed in series between one end of the secondary coil and the output terminal; and
a first capacitor connected between a path connecting the one end and the first inductor and a ground,
wherein one end of the primary coil is connected to an output end of the first amplifier,
wherein another end of the primary coil is connected to an output end of the second amplifier,
wherein another end of the secondary coil is connected to the ground,
wherein the secondary coil and the first inductor are disposed so as to be adjacent to each other, and
wherein, assuming the first inductor is viewed in a direction of a winding axis of the secondary coil, the secondary coil and the first inductor at least partially overlap each other, and, assuming the secondary coil is viewed in a direction of a winding axis of the first inductor, the first inductor and the secondary coil at least partially overlap each other.

<3>
The radio-frequency module according to <1> or <2>,
wherein the first capacitor is connected to a first node on the path, and
wherein there are no inductors connected between the first node and the first capacitor and between the first capacitor and the ground.

<4>
The radio-frequency module according to <1> or <2>,
wherein the secondary coil and the first inductor are coupled to each other in opposite polarity via magnetic field coupling.

<5>
The radio-frequency module according to any of <1> to <4>,
wherein, in bandpass characteristics of a radio-frequency signal from the one end of the secondary coil to the output terminal, an attenuation pole corresponding to LC series resonance that occurs due to a mutual inductance component generated by magnetic field coupling between the secondary coil and the first inductor and the first capacitor is formed.

<6>
The radio-frequency module according to any of <1> to <4>, further comprising
a module substrate,
wherein the secondary coil is a planar coil formed in the module substrate, and
wherein the first inductor is a chip inductor disposed on the module substrate.

<7>
The radio-frequency module according to any of <1> to <4>, further comprising
a module substrate,
wherein the first inductor is a planar coil formed in the module substrate, and
wherein the transformer is a planar coil formed in the module substrate.

<8>
The radio-frequency module according to any of <1> to <4>, further comprising
a module substrate,
wherein the first inductor is a planar coil formed in the module substrate, and
wherein the transformer is a chip transformer disposed on the module substrate.

<9>
The radio-frequency module according to any of <1> to <4>, further comprising
a module substrate,
wherein the first inductor is a chip inductor formed on the module substrate,
wherein the transformer is a chip transformer disposed on the module substrate, and
wherein the first inductor and the transformer are disposed on the module substrate so as to be adjacent to each other.

<10>
A radio-frequency module comprising:
a first amplifier and a second amplifier;
an output terminal;
a first LC series circuit including a first inductor and a first capacitor connected in series with each other;
a second LC series circuit including a second inductor and a second capacitor connected in series with each other;
a first matching network including a third inductor and a third capacitor; and
a second matching network including a fourth inductor and a fourth capacitor, wherein the first LC series circuit is connected between a first path connecting an output end of the first amplifier and the output terminal and a ground, wherein the second LC series circuit is connected between a second path connecting an output end of the second amplifier and the output terminal and the ground, wherein the first matching network is connected to the first path, and the second matching network is connected to the second path, and wherein the first inductor and the second inductor are coupled to each other via magnetic field coupling.

<11>

The radio-frequency module according to <10>, wherein the first inductor and the second inductor are disposed so as to be adjacent to each other, and wherein a winding axis of the first inductor and a winding axis of the second inductor are parallel to each other.

<12>

The radio-frequency module according to <10> or <11>, wherein the third inductor is disposed in series between a first node, on the first path, to which the first LC series circuit is connected and the output end of the first amplifier, wherein the third capacitor is connected between a path connecting the output end of the first amplifier and the third inductor and the ground, wherein the fourth inductor is disposed in series between a second node, on the second path, to which the second LC series circuit is connected and the output end of the second amplifier, and wherein the fourth capacitor is connected between a path connecting the output end of the second amplifier and the fourth inductor and the ground.

<13>

The radio-frequency module according to any of <10> to <12>, further comprising a fifth inductor disposed between the first inductor and the second inductor and having both ends connected to the ground.

<14>

The radio-frequency module according to <13>, further comprising a module substrate, wherein the first inductor and the second inductor are disposed so that respective winding axes are perpendicular to a main surface of the module substrate, and wherein the fifth inductor is a ground coil formed in or on the module substrate so as to be adjacent to the first inductor and the second inductor and surround the first inductor and the second inductor assuming the main surface of the module substrate is viewed in plan.

<15>

A communication device comprising:

a signal processing circuit configured to process a radio-frequency signal; and the radio-frequency module according to any of <1> to <14> configured to transmit the radio-frequency signal between the signal processing circuit and an antenna.

The present disclosure can be widely used, as a radio-frequency module disposed in a front-end unit, and a communication device, for communication equipment, such as mobile phones.

What is claimed is:

1. A radio-frequency module comprising:

a first amplifier and a second amplifier;

a transformer including a primary coil and a secondary coil;

an output terminal;

a first inductor disposed in series between one end of the secondary coil and the output terminal; and a first capacitor connected between a path connecting the one end and the first inductor and a ground, wherein one end of the primary coil is connected to an output end of the first amplifier, wherein another end of the primary coil is connected to an output end of the second amplifier, wherein another end of the secondary coil is connected to the ground, and wherein the secondary coil and the first inductor are coupled to each other via magnetic field coupling.

2. The radio-frequency module according to claim 1, wherein the first capacitor is connected to a first node on the path, and wherein there are no inductors connected between the first node and the first capacitor and between the first capacitor and the ground.

3. The radio-frequency module according to claim 1, wherein the secondary coil and the first inductor are coupled to each other in opposite polarity via magnetic field coupling.

4. The radio-frequency module according to claim 1, wherein, in bandpass characteristics of a radio-frequency signal from the one end of the secondary coil to the output terminal, an attenuation pole corresponding to LC series resonance that occurs due to a mutual inductance component generated by magnetic field coupling between the secondary coil and the first inductor and the first capacitor is formed.

5. The radio-frequency module according to claim 1, further comprising:

a module substrate, wherein the secondary coil is a planar coil formed in the module substrate, and the first inductor is a chip inductor disposed on the module substrate, or wherein the first inductor is a planar coil formed in the module substrate, and the transformer is a planar coil formed in the module substrate, or wherein the first inductor is a planar coil formed in the module substrate, and the transformer is a chip transformer disposed on the module substrate, or wherein the first inductor is a chip inductor formed on the module substrate, the transformer is a chip transformer disposed on the module substrate, and the first inductor and the transformer are disposed on the module substrate so as to be adjacent to each other.

6. A radio-frequency module comprising:

a first amplifier and a second amplifier;

a transformer including a primary coil and a secondary coil;

an output terminal;

a first inductor disposed in series between one end of the secondary coil and the output terminal; and a first capacitor connected between a path connecting the one end and the first inductor and a ground, wherein one end of the primary coil is connected to an output end of the first amplifier, wherein another end of the primary coil is connected to an output end of the second amplifier, wherein another end of the secondary coil is connected to the ground, wherein the secondary coil and the first inductor are disposed so as to be adjacent to each other, and wherein, assuming the first inductor is viewed in a direction of a winding axis of the secondary coil, the secondary coil and the first inductor at least partially overlap each other, and, assuming the secondary coil is viewed in a direction of a winding axis of the first inductor, the first inductor and the secondary coil at least partially overlap each other.

7. The radio-frequency module according to claim 6, wherein the first capacitor is connected to a first node on the path, and wherein there are no inductors connected between the first node and the first capacitor and between the first capacitor and the ground.

8. The radio-frequency module according to claim 6, wherein the secondary coil and the first inductor are coupled to each other in opposite polarity via magnetic field coupling.

9. The radio-frequency module according to claim 6, wherein, in bandpass characteristics of a radio-frequency signal from the one end of the secondary coil to the output terminal, an attenuation pole corresponding to LC series resonance that occurs due to a mutual inductance component generated by magnetic field coupling between the secondary coil and the first inductor and the first capacitor is formed.

10. The radio-frequency module according to claim 6, further comprising:

a module substrate, wherein the secondary coil is a planar coil formed in the module substrate, and the first inductor is a chip inductor disposed on the module substrate, or wherein the first inductor is a planar coil formed in the module substrate, and the transformer is a planar coil formed in the module substrate, or wherein the first inductor is a planar coil formed in the module substrate, and the transformer is a chip transformer disposed on the module substrate, or wherein the first inductor is a chip inductor formed on the module substrate, the transformer is a chip transformer disposed on the module substrate, and the first inductor and the transformer are disposed on the module substrate so as to be adjacent to each other.

11. A radio-frequency module comprising:

a first amplifier and a second amplifier;

an output terminal;

a first LC series circuit including a first inductor and a first capacitor connected in series with each other;

a second LC series circuit including a second inductor and a second capacitor connected in series with each other;

a first matching network including a third inductor and a third capacitor; and a second matching network including a fourth inductor and a fourth capacitor, wherein the first LC series circuit is connected between a first path connecting an output end of the first amplifier and the output terminal and a ground, wherein the second LC series circuit is connected between a second path connecting an output end of the second amplifier and the output terminal and the ground, wherein the first matching network is connected to the first path, wherein the second matching network is connected to the second path, and wherein the first inductor and the second inductor are coupled to each other via magnetic field coupling.

12. The radio-frequency module according to claim 11, wherein the first inductor and the second inductor are disposed so as to be adjacent to each other, and wherein a winding axis of the first inductor and a winding axis of the second inductor are parallel to each other.

13. The radio-frequency module according to claim 11, wherein the third inductor is disposed in series between a first node, on the first path, to which the first LC series circuit is connected and the output end of the first amplifier, wherein the third capacitor is connected between a path connecting the output end of the first amplifier and the third inductor and the ground, wherein the fourth inductor is disposed in series between a second node, on the second path, to which the second LC series circuit is connected and the output end of the second amplifier, and wherein the fourth capacitor is connected between a path connecting the output end of the second amplifier and the fourth inductor and the ground.

14. The radio-frequency module according to claim 13, further comprising:

a fifth inductor disposed between the first inductor and the second inductor and having both ends connected to the ground.

15. The radio-frequency module according to claim 14, further comprising:

a module substrate, wherein the first inductor and the second inductor are disposed so that respective winding axes are perpendicular to a main surface of the module substrate, and wherein the fifth inductor is a ground coil formed in or on the module substrate so as to be adjacent to the first inductor and the second inductor and surround the first inductor and the second inductor assuming the main surface of the module substrate is viewed in plan.

16. The radio-frequency module according to claim 12, wherein the third inductor is disposed in series between a first node, on the first path, to which the first LC series circuit is connected and the output end of the first amplifier, wherein the third capacitor is connected between a path connecting the output end of the first amplifier and the third inductor and the ground, wherein the fourth inductor is disposed in series between a second node, on the second path, to which the second LC series circuit is connected and the output end of the second amplifier, and wherein the fourth capacitor is connected between a path connecting the output end of the second amplifier and the fourth inductor and the ground.

17. The radio-frequency module according to claim 16, further comprising:

a fifth inductor disposed between the first inductor and the second inductor and having both ends connected to the ground; and a module substrate, wherein the first inductor and the second inductor are disposed so that respective winding axes are perpendicular to a main surface of the module substrate, and wherein the fifth inductor is a ground coil formed in or on the module substrate so as to be adjacent to the first inductor and the second inductor and surround the first inductor and the second inductor assuming the main surface of the module substrate is viewed in plan.

18. A communication device comprising:

a signal processing circuit configured to process a radio-frequency signal; and the radio-frequency module according to claim 1 configured to transmit the radio-frequency signal between the signal processing circuit and an antenna.

19. A communication device comprising:

a signal processing circuit configured to process a radio-frequency signal; and the radio-frequency module according to claim 6 configured to transmit the radio-frequency signal between the signal processing circuit and an antenna.

20. A communication device comprising:

a signal processing circuit configured to process a radio-frequency signal; and the radio-frequency module according to claim 11 configured to transmit the radio-frequency signal between the signal processing circuit and an antenna.

* * * * *